(12) United States Patent
Yamazaki

(10) Patent No.: US 9,099,303 B2
(45) Date of Patent: *Aug. 4, 2015

(54) METHOD FOR MANUFACTURING SEMICONDUCTOR DEVICE

(71) Applicant: Semiconductor Energy Laboratory Co., Ltd., Atsugi-shi, Kanagawa-ken (JP)

(72) Inventor: Shunpei Yamazaki, Setagaya (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

This patent is subject to a terminal disclaimer.

(21) Appl. No.: 14/208,280

(22) Filed: Mar. 13, 2014

(65) Prior Publication Data

US 2014/0193947 A1    Jul. 10, 2014

Related U.S. Application Data

(63) Continuation of application No. 13/713,272, filed on Dec. 13, 2012, now Pat. No. 8,748,240.

(30) Foreign Application Priority Data

Dec. 22, 2011  (JP) .................. 2011-281566

(51) Int. Cl.
    *H01L 21/00* (2006.01)
    *H01L 21/02* (2006.01)
    (Continued)

(52) U.S. Cl.
    CPC .... *H01L 21/02323* (2013.01); *H01L 21/02365* (2013.01); *H01L 21/02554* (2013.01);
    (Continued)

(58) Field of Classification Search
    USPC .......................................................... 438/149
    See application file for complete search history.

(56) References Cited

U.S. PATENT DOCUMENTS 5,731,856 A  3/1998 Kim et al.
5,744,864 A  4/1998 Cillessen et al.
(Continued)

FOREIGN PATENT DOCUMENTS

EP  1 737 044 A  12/2006
EP  2 226 847 A  9/2010
(Continued)

OTHER PUBLICATIONS

Fortunato et al., "Wide-Bandgap High-Mobility ZNO Thin-Film Transistors Produced at Room Temperature," Appl. Phys. Lett. (Applied Physics Letters), Sep. 27, 2004, vol. 85, No. 13, pp. 2541-2543.

(Continued)

*Primary Examiner* — Asok K Sarkar
(74) *Attorney, Agent, or Firm* — Eric J. Robinson; Robinson Intellectual Property Law Office, P.C.

(57) ABSTRACT

Oxygen vacancies in an oxide semiconductor film and the vicinity of the oxide semiconductor film are reduced and electric characteristics of a transistor including the oxide semiconductor film are improved. Further, a highly reliable semiconductor device including the transistor including the oxide semiconductor film is provided. In the transistor including the oxide semiconductor film, at least one insulating film in contact with the oxide semiconductor film contains excess oxygen. By the excess oxygen included in the insulating film in contact with the oxide semiconductor film, oxygen vacancies in the oxide semiconductor film and the vicinity of the oxide semiconductor film can be reduced. Note that the insulating film including the excess oxygen has a profile of the excess oxygen concentration having two or more local maximum values in the depth direction.

15 Claims, 21 Drawing Sheets

(51) Int. Cl.
  *H01L 21/3105* (2006.01)
  *H01L 21/477* (2006.01)
  *H01L 21/265* (2006.01)
  *H01L 29/786* (2006.01)
  *H01L 29/66* (2006.01)
  *H01L 21/77* (2006.01)

(52) U.S. Cl.
  CPC .... *H01L21/02631* (2013.01); *H01L 21/02664* (2013.01); *H01L 21/265* (2013.01); *H01L 21/3105* (2013.01); *H01L 21/477* (2013.01); *H01L 29/66969* (2013.01); *H01L 29/7869* (2013.01); *H01L 29/78603* (2013.01); *H01L 2021/775* (2013.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 8,237,166 B2 | 8/2012 | Kumomi et al. |
| 8,748,240 B2 * | 6/2014 | Yamazaki ..................... 438/149 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0072233 A1 | 3/2009 | Hayashi et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0142887 A1 | 6/2009 | Son et al. |
| 2009/0152506 A1 | 6/2009 | Umeda et al. |
| 2009/0152541 A1 | 6/2009 | Maekawa et al. |
| 2009/0174012 A1 | 7/2009 | Iwasaki |
| 2009/0278122 A1 | 11/2009 | Hosono et al. |
| 2009/0280600 A1 | 11/2009 | Hosono et al. |
| 2009/0321731 A1 | 12/2009 | Jeong et al. |
| 2010/0044864 A1 | 2/2010 | Maekawa et al. |
| 2010/0051940 A1 | 3/2010 | Yamazaki et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0260171 A1 | 10/2011 | Yamazaki |
| 2011/0263082 A1 | 10/2011 | Yamazaki |
| 2011/0263083 A1 | 10/2011 | Yamazaki |
| 2011/0263084 A1 | 10/2011 | Yamazaki |
| 2011/0263085 A1 | 10/2011 | Yamazaki |
| 2011/0263091 A1 | 10/2011 | Yamazaki |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 | 6/2006 |
| JP | 2007-073558 | 3/2007 |
| JP | 2007-073563 | 3/2007 |
| JP | 2008-060419 | 3/2008 |

(56) References Cited

FOREIGN PATENT DOCUMENTS

| JP | 2009-224737 | 10/2009 |
|---|---|---|
| JP | 2010-062276 | 3/2010 |
| WO | 2004/114391 | 12/2004 |

OTHER PUBLICATIONS

Dembo et al., "RFCPUS on Glass and Plastic Substrates Fabricated by TFT Transfer Technology," IEDM 05: Technical Digest of International Electron Devices Meeting, Dec. 5, 2005, pp. 1067-1069.

Ikeda et al., "Full-Functional System Liquid Crystal Display Using CG-Silicon Technology," SID Digest '04: SID International Symposium Digest of Technical Papers, 2004, vol. 35, pp. 860-863.

Nomura et al., "Room-Temperature Fabrication of Transparent Flexible Thin-Film Transistors Using Amorphous Oxide Semiconductors," Nature, Nov. 25, 2004, vol. 432, pp. 488-492.

Park et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Takahashi et al., "Theoretical Analysis of IGZO Transparent Amorphous Oxide Semiconductor," IDW '08: Proceedings of the 15th International Display Workshops, Dec. 3, 2008, pp. 1637-1640.

Hayashi et al., "42.1: Invited Paper: Improved Amorphous In—Ga—Zn—O TFTs," SID Digest '08: SID International Symposium Digest of Technical Papers, May 20, 2008, vol. 39, pp. 621-624.

Prins et al., "A Ferroelectric Transparent Thin-Film Transistor," Appl. Phys. Lett. (Applied Physics Letters), Jun. 17, 1996, vol. 68, No. 25, pp. 3650-3652.

Nakamura et al., "The Phase Relations in the $In_2O_3$—$Ga_2ZnO_4$—ZnO System at 1350° C.," Journal of Solid State Chemistry, Aug. 1, 1991, vol. 93, No. 2, pp. 298-315.

Kimizuka et al., "Syntheses and Single-Crystal Data of Homologous Compounds, $In_2O_3(ZnO)_m$ ($m$=3, 4, and 5), $InGaO_3(ZnO)_3$, and $Ga_2O_3(ZnO)_m$ ($m$=7, 8, 9, and 16) in the $In_2O_3$—$ZnGa_2O_4$—ZnO System," Journal of Solid State Chemistry, Apr. 1, 1995, vol. 116, No. 1, pp. 170-178.

Nomura et al., "Thin-Film Transistor Fabricated in Single-Crystalline Transparent Oxide Semiconductor," SCIENCE, May 23, 2003, vol. 300, No. 5623, pp. 1269-1272.

Masuda et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Asakuma et al., "Crystallization and Reduction of Sol-Gel-Derived Zinc Oxide Films by Irradiation with Ultraviolet Lamp," Journal of Sol-Gel Science and Technology, 2003, vol. 26, pp. 181-184.

Osada et al., "15.2: Development of Driver-Integrated Panel using Amorphous In—Ga—Zn—Oxide TFT," SID Digest '09: SID International Symposium Digest of Technical Papers, May 31, 2009, pp. 184-187.

Nomura et al., "Carrier transport in transparent oxide semiconductor with intrinsic structural randomness probed using single-crystalline $InGaO_3(ZnO)_5$ films," Appl. Phys. Lett. (Applied Physics Letters), Sep. 13, 2004, vol. 85, No. 11, pp. 1993-1995.

Li et al., Modulated Structures of Homologous Compounds $InMO_3(ZnO)_m$ ($M$=In,Ga; $m$=Integer) Described by Four-Dimensional Superspace Group, Journal of Solid State Chemistry, 1998, vol. 139, pp. 347-355.

Son et al., "42.4L: Late-News Paper: 4 Inch QVGA AMOLED Driven by the Threshold Voltage Controlled Amorphous GIZO ($Ga_2O_3$—$In_2O_3$—ZnO) TFT," SID Digest '08: SID International Symposium Digest of Technical Papers, May 20, 2008, vol. 39, pp. 633-636.

Lee et al., "World's Largest (15-inch) XGA AMLCD Panel Using IGZO Oxide TFT," SID Digest '08: SID International Symposium Digest of Technical Papers, May 20, 2008, vol. 39, pp. 625-628.

Nowatari et al., "60.2: Intermediate Connector with Suppressed Voltage Loss for White Tandem OLEDs," SID Digest '09: SID International Symposium Digest of Technical Papers, May 31, 2009, vol. 40, pp. 899-902.

Kanno et al., "White Stacked Electrophosphorecent Organic Light-Emitting Devices Employing $MoO_3$ as a Charge-Generation Layer," Adv. Mater. (Advanced Materials), 2006, vol. 18, No. 3, pp. 339-342.

Tsuda et al., "Ultra Low Power Consumption Technologies for Mobile TFT-LCDs," IDW '02: Proceedings of the 9$^{th}$ International Display Workshops, Dec. 4, 2002, pp. 295-298.

Van de Walle, "Hydrogen as a Cause of Doping in Zinc Oxide," Phys. Rev. Lett. (Physical Review Letters), Jul. 31, 2000, vol. 85, No. 5, pp. 1012-1015.

Fung et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, the Japan Society of Applied Physics.

Jeong et al., "3.1: Distinguished Paper: 12.1-Inch WXGA AMOLED Display Driven by Indium—Gallium—Zinc Oxide TFTs Array," SID Digest '08: SID International Symposium Digest of Technical Papers, May 20, 2008, vol. 39, No. 1, pp. 1-4.

Park et al., "High performance amorphous oxide thin film transistors with self-aligned top-gate structure," IEDM 09: Technical Digest of International Electron Devices Meeting, Dec. 7, 2009, pp. 191-194.

Kurokawa et al., "UHF RFCPUs on Flexible and Glass Substrates for Secure RFID Systems," Journal of Solid-State Circuits, 2008, vol. 43, No. 1, pp. 292-299.

Ohara et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, the Japan Society of Applied Physics.

Coates et al., "Optical Studies of the Amorphous Liquid-Cholesteric Liquid Crystal Transition: the "Blue Phase"," Physics Letters, Sep. 10, 1973, vol. 45A, No. 2, pp. 115-116.

Cho et al., "21.2: Al and Sn-doped Zinc Indium Oxide Thin Film Transistors for AMOLED Back-Plane," SID Digest '09: SID International Symposium Digest of Technical Papers, May 31, 2009, pp. 280-283.

Lee et al., "15.4: Excellent Performance of Indium—Oxide—Based Thin-Film Transistors by DC Sputtering," SID Digest '09: SID International Symposium Digest of Technical Papers, May 31, 2009, pp. 191-193.

Jin et al., "65.2: Distinguished Paper: World-Largest (6.5Δ) Flexible Full Color Top Emission AMOLED Display on Plastic Film and its Bending Properties," SID Digest '09: SID International Symposium Digest of Technical Papers, May 31, 2009, pp. 983-985.

Sakata et al., "Development of 4.0-In. AMOLED Display with Driver Circuit Using Amorphous In—Ga—Zn—Oxide TFTs," IDW '09: Proceedings of the 16th International Display Workshops, 2009, pp. 689-692.

Park et al., "Amorphous Indium—Gallium—Zinc Oxide TFTs and their Application for Large Size AMOLED," AM-FPD '08 Digest of Technical Papers, Jul. 2, 2008, pp. 275-278.

Park et al., "Challenge to Future Displays: Transparent AM-OLED Driven by PEALD Grown ZnO TFT," IMID '07 Digest, 2007, pp. 1249-1252.

Godo et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Osada et al., "Development of Driver-Integrated Panel using Amorphous In—GaZn—Oxide TFT," AM-FPD '09 Digest of Technical Papers, Jul. 1, 2009, pp. 33-36.

Hirao et al., "Novel Top-Gate Zinc Oxide Thin-Film Transistors (ZnO TFTs) for AMLCDs," Journal of the SID, 2007, vol. 15, No. 1, pp. 17-22.

Hosono, "68.3: Invited Paper: Transparent Amorphous Oxide Semiconductors for High Performance TFT," SID Digest '07: SID International Symposium Digest of Technical Papers, 2007, vol. 38, pp. 1830-1833.

Godo et al., "P-9: Numerical Analysis on Temperature Dependence of Characteristics of Amorphous In—Ga—Zn—Oxide TFT," SID Digest '09: SID International Symposium Digest of Technical Papers, May 31, 2009, pp. 1110-1112.

Ohara et al., "21.3: 4.0 In. QVGA Amoled Display Using In—Ga—Zn—Oxide TFTs with a Novel Passivation Layer," SID Digest '09: SID International Symposium Digest of Technical Papers, May 31, 2009, pp. 284-287.

(56) References Cited

OTHER PUBLICATIONS

Miyasaka, "Suftla Flexible Microelectronics on their Way to Business," SID Digest '07: SID International Symposium Digest of Technical Papers, 2007, vol. 38, pp. 1673-1676.

Chern et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Kikuchi et al., "39.1: Invited Paper: Optically Isotropic Nano-Structured Liquid Crystal Composites for Display Applications," SID Digest '09: SID International Symposium.

Asaoka et al., "29.1: Polarizer-Free Reflective LCD Combined With Ultra Low-Power Driving Technology," SID Digest '09: SID International Symposium Digest of Technical Papers, May 31, 2009, pp. 395-398.

Lee et al., "Current Status of, Challenges to, and Perspective View of AM-OLED," IDW '06: Proceedings of the 13$^{th}$ International Display Workshops, Dec. 7, 2006, pp. 663-666.

Kikuchi et al., "62.2: Invited Paper: Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.

Nakamura, "Synthesis of Homologous Compound with New Long-Period Structure," NIRIM Newsletter, Mar. 1, 1995, vol. 150, pp. 1-4.

Kikuchi et al., "Polymer-Stabilized Liquid Crystal Blue Phases," Nature Materials, Sep. 2, 2002, vol. 1, pp. 64-68.

Kimizuka et al., "Spinel, $YbFe_2O_4$, and $Yb_2Fe_3O_7$ Types of Structures for Compounds in the $In_2O_3$ and $Sc_2O_3$—$A_2O_3$—BO Systems [A: Fe, Ga, Or Al; B: Mg, Mn, Fe, Ni, Cu, or Zn] at Temperatures Over 1000° C.," Journal of Solid State Chemistry, 1985, vol. 60, pp. 382-384.

Kitzerow et al., "Observation of Blue Phases in Chiral Networks," Liquid Crystals, 1993, vol. 14, No. 3, pp. 911-916.

Costello et al., "Electron Microscopy of a Cholesteric Liquid Crystal and its Blue Phase," Phys. Rev. A (Physical Review A), May 1, 1984, vol. 29, No. 5, pp. 2957-2959.

Meiboom et al., "Theory of the Blue Phase of Cholesteric Liquid Crystals," Phys. Rev. Lett. (Physical Review Letters), May 4, 1981, vol. 46, No. 18, pp. 1216-1219.

Park et al., "42.3: Transparent ZnO Thin Film Transistor for the Application of High Aperture Ratio Bottom Emission AM-OLED Display," SID Digest '08: SID International Symposium Digest of Technical Papers, May 20, 2008, vol. 39, pp. 629-632.

Orita et al., "Mechanism of Electrical Conductivity of Transparent $InGaZnO_4$," Phys. Rev. B (Physical Review B), Jan. 15, 2000, vol. 61, No. 3, pp. 1811-1816.

Nomura et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Janotti et al., "Native Point Defects in ZnO," Phys. Rev. B (Physical Review. B), Oct. 4, 2007, vol. 76, No. 16, pp. 165202-1-165202-22.

Park et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Hsieh et al., "P-29: Modeling of Amorphous Oxide Semiconductor Thin Film Transistors and Subgap Density of States," SID Digest '08: SID International Symposium Digest of Technical Papers, 2008, vol. 39, pp. 1277-1280.

Janotti et al., "Oxygen Vacancies in ZnO," Appl. Phys. Lett. (Applied Physics Letters), 2005, vol. 87, pp. 122102-1-122102-3.

Oba et al., "Defect energetics in ZnO: A hybrid Hartree-Fock density functional study," Phys. Rev. B (Physical Review B), 2008, vol. 77, pp. 245202-1245202-6.

Orita et al., "Amorphous transparent conductive oxide $InGaO_3(ZnO)_m$ (m<4): a Zn 4s conductor," Philosophical Magazine, 2001, vol. 81, No. 5, pp. 501-515.

Hosono et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Mo et al., "Amorphous Oxide TFT Backplanes for Large Size AMOLED Displays," IDW '08: Proceedings of the 6$^{th}$ International Display Workshops, Dec. 3, 2008, pp. 581-584.

Kim et al., "High-Performance oxide thin film transistors passivated by various gas plasmas," 214$^{th}$ ECS Meeting, 2008, No. 2317, ECS.

Clark et al., "First Principles Methods Using CASTEP," Zeitschrift fur Kristallographie, 2005, vol. 220, pp. 567-570.

Lany et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Park et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Oh et al., "Improving the Gate Stability of ZnO Thin-Film Transistors with Aluminum Oxide Dielectric Layers," J. Electrochem. Soc. (Journal of the Electrochemical Society), 2008, vol. 155, No. 12, pp. H1009-H1014.

Ueno et al., "Field-Effect Transistor on $SrTiO_3$ with Sputtered $Al_2O_3$ Gate Insulator," Appl. Phys. Lett. (Applied Physics Letters), Sep. 1, 2003, vol. 83, No. 9, pp. 1755-1757.

\* cited by examiner

METHOD FOR MANUFACTURING SEMICONDUCTOR DEVICE

BACKGROUND OF THE INVENTION

1. Field of the Invention

The present invention relates to a method for manufacturing a semiconductor device.

Note that in this specification, a semiconductor device refers to any device that can function by utilizing semiconductor characteristics, and an electro-optical device, a semiconductor circuit, an electronic device, and the like are all semiconductor devices.

2. Description of the Related Art

A technique for forming a transistor by using a semiconductor film formed over a substrate having an insulating surface has attracted attention. The transistor is applied to a wide range of semiconductor devices such as an integrated circuit (IC) and an image display device (display device). Although a silicon film is known as a semiconductor film applicable to the transistor, an oxide semiconductor film has attracted attention in recent years.

For example, a transistor is disclosed in which an amorphous oxide semiconductor film containing indium, gallium, and zinc and having an electron carrier concentration of lower than $10^{18}/cm^3$ is used (see Patent Document 1).

A transistor including an oxide semiconductor film has high electron mobility in the oxide semiconductor film as compared to a transistor including an amorphous silicon film; thus, operation speed thereof can be drastically increased. In addition, there is an advantage that capital investment can be reduced because part of production equipment for a transistor including an amorphous silicon film can be retrofitted and utilized.

REFERENCE

Patent Document

[Patent Document 1] Japanese Published Patent Application No. 2006-165528

SUMMARY OF THE INVENTION

When oxygen vacancies are caused in an oxide semiconductor film and the vicinity of the oxide semiconductor film, some of the oxygen vacancies serve as donors to generate electrons. Therefore, the threshold voltage of a transistor including an oxide semiconductor film having oxygen vacancies is shifted in the negative direction in some cases. Note that in this specification, the vicinity of an oxide semiconductor film means a region including the vicinity of an interface between the oxide semiconductor film and a film in contact with the oxide semiconductor film.

An object of an embodiment of the present invention is to reduce oxygen vacancies in an oxide semiconductor film and the vicinity of the oxide semiconductor film and improve electric characteristics of a transistor including the oxide semiconductor film.

Another object of an embodiment of the present invention is to provide a highly reliable semiconductor device that includes a transistor including an oxide semiconductor film.

An embodiment of the present invention is a transistor including an oxide semiconductor film. At least one insulating film in contact with the oxide semiconductor film includes excess oxygen.

Oxygen vacancies in the oxide semiconductor film and the vicinity of the oxide semiconductor film can be reduced owing to the excess oxygen included in the insulating film in contact with the oxide semiconductor film.

Note that the profile of excess oxygen concentration in the insulating film including the excess oxygen has two or more local maximum values in the depth direction. Note that the depth at which the excess oxygen concentration has the local maximum value may be 0 (i.e., at a surface of the insulating film) in some cases. One of the local maximum values of the excess oxygen concentration in the insulating film is the largest value of the excess oxygen concentration. Note that in general, the depth at which the excess oxygen concentration has the local maximum value corresponds to the depth at which the oxygen concentration has the local maximum value.

In the case where excess oxygen concentration in an insulating film has two or more local maximum values in the depth direction, the insulating film has two or more conditions of oxygen release. Specifically, oxygen release corresponding to the local maximum value of the excess oxygen concentration in a shallow region is caused by low energy. Oxygen release corresponding to the local maximum value of the excess oxygen concentration in a deep region is caused by high energy. Note that the energy can also be called the temperature of heat treatment.

Thus, the insulating film having different conditions of oxygen release can release oxygen at a wide range of temperatures in the case where the oxygen is released by heat treatment, for example. Accordingly, the oxygen can be supplied to the oxide semiconductor film and the vicinity of the oxide semiconductor film at a wide range of temperatures.

The insulating film having two or more local maximum values of the excess oxygen concentration in the depth direction may be formed in such a manner that an insulating film is formed and oxygen is added to the insulating film plural times, for example.

The oxygen may be added by an ion implantation method, an ion doping method, or the like. In particular, an ion implantation method capable of adding only oxygen by mass separation is preferable because it allows less entrance of an impurity. Alternatively, the oxygen may be added in such a manner that bias voltage is applied to the insulating film side in plasma containing oxygen.

Further alternatively, the insulating film having the profile of the excess oxygen concentration having two or more local maximum values in the depth direction may be formed in such a manner that an insulating film is formed, oxygen is added to the insulating film under a first condition, and then oxygen is added to the insulating film under a second condition.

At this time, the first condition and the second condition are determined so that depths at which oxygen is implanted are different. Specifically, the oxygen is added by an ion implantation method with an acceleration voltage of higher than or equal to 10 kV and lower than or equal to 100 kV as the first condition and then by an ion implantation method with an acceleration voltage of higher than or equal to 1 kV and lower than 10 kV as the second condition. Alternatively, the oxygen may be added in such a manner that an ion implantation method with an acceleration voltage of higher than or equal to 10 kV and lower than or equal to 100 kV is performed as the first condition and a bias voltage of higher than or equal to 10 V and lower than 1 kV is applied to the substrate side in plasma containing oxygen as the second condition.

The first condition and the second condition may be replaced with each other. Note that it is preferable that the depth at which oxygen is implanted under the first condition be deeper than that at which oxygen is implanted under the second condition. This is for the prevention of interference between oxygen added under the first condition and oxygen added under the second condition. This also applies to the case where oxygen is added plural times; it is preferable that the depth at which oxygen is implanted be shallower in order of oxygen addition.

An embodiment of the present invention is a method for manufacturing a semiconductor device, including the steps of forming a base insulating film over a substrate; adding oxygen to the base insulating film plural times; forming an oxide semiconductor film over the base insulating film to which the oxygen is added plural times; forming a gate insulating film over the oxide semiconductor film; and forming a gate electrode overlapping with the oxide semiconductor film with the gate insulating film interposed therebetween.

Another embodiment of the present invention is a method for manufacturing a semiconductor device, including the steps of forming a base insulating film over a substrate; forming a gate electrode over the base insulating film; forming a gate insulating film over the gate electrode; adding oxygen to the gate insulating film plural times; and forming an oxide semiconductor film overlapping with the gate electrode with the gate insulating film to which the oxygen is added plural times interposed therebetween.

Another embodiment of the present invention is a method for manufacturing a semiconductor device, including the steps of forming a base insulating film over a substrate; adding oxygen to the base insulating film under a first condition and then under a second condition; forming an oxide semiconductor film over the base insulating film to which the oxygen is added under the first condition and the second condition; forming a gate insulating film over the oxide semiconductor film; and forming a gate electrode overlapping with the oxide semiconductor film with the gate insulating film interposed therebetween.

Another embodiment of the present invention is a method for manufacturing a semiconductor device, including the steps of forming a base insulating film over a substrate; forming a gate electrode over the base insulating film; forming a gate insulating film over the gate electrode; adding oxygen to the gate insulating film under a first condition and then under a second condition; and forming an oxide semiconductor film overlapping with the gate electrode with the gate insulating film to which the oxygen is added under the first condition and the second condition interposed therebetween.

Oxygen can be efficiently supplied to an oxide semiconductor film from an insulating film in contact with the oxide semiconductor film, so that oxygen vacancies in the oxide semiconductor film and the vicinity of the oxide semiconductor film can be reduced. Thus, electric characteristics of a transistor including the oxide semiconductor film can be improved.

Further, reliability of a semiconductor device that includes the transistor including the oxide semiconductor film can be increased.

DETAILED DESCRIPTION OF THE INVENTION

Figure 1A:
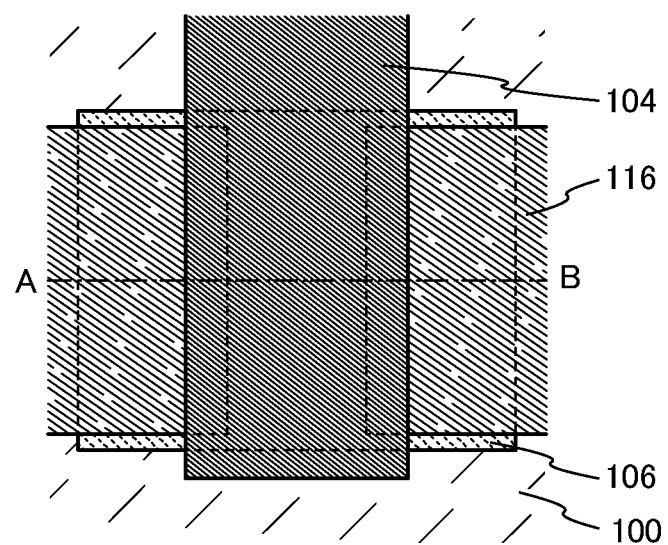
FIGS. 1A and 1B are a top view and a cross-sectional view illustrating an example of a transistor according to an embodiment of the present invention.

Embodiments and an example of the present invention will be described in detail with reference to the accompanying drawings. However, the present invention is not limited to the description below, and it is easily understood by those skilled in the art that modes and details disclosed herein can be modified in various ways. Therefore, the present invention is not construed as being limited to description of the embodiments and the example. In describing structures of the present invention with reference to the drawings, the same reference numerals are used in common for the same portions in different drawings. Note that the same hatch pattern is applied to similar parts, and the similar parts are not especially denoted by reference numerals in some cases.

Note that the ordinal numbers such as "first" and "second" are used for convenience and do not denote the order of steps or the stacking order of layers. In addition, the ordinal numbers in this specification do not denote particular names which specify the present invention.

Embodiment 1

In this embodiment, a transistor according to an embodiment of the present invention will be described with reference to FIGS. 1A and 1B, FIGS. 2A and 2B, FIGS. 3A to 3C, and FIGS. 4A to 4C.

Figure 1B:
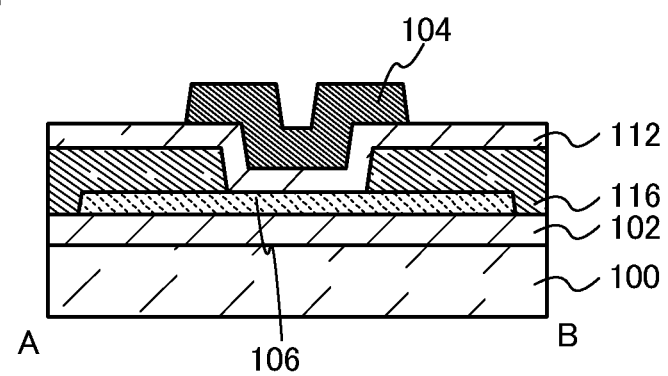

FIG. 1A is a top view of a transistor according to an embodiment of the present invention. FIG. 1B is a cross-sectional view along dashed-dotted line A-B in FIG. 1A. Note that for simplicity, a gate insulating film 112, a base insulating film 102, and the like are not shown in FIG. 1A.

The transistor in FIG. 1B includes the base insulating film 102 provided over a substrate 100, an oxide semiconductor film 106 provided over the base insulating film 102, a pair of electrodes 116 provided over the oxide semiconductor film 106, the gate insulating film 112 provided over the oxide semiconductor film 106 and the pair of electrodes 116, and a gate electrode 104 provided to overlap with the oxide semiconductor film 106 with the gate insulating film 112 provided therebetween.

Note that at least one of the base insulating film 102 and the gate insulating film 112 is an insulating film having a profile of excess oxygen concentration having two or more local maximum values in the depth direction. Note that the depth at which the excess oxygen concentration has the local maximum value may be 0 (i.e., at a surface of the insulating film) in some cases. One of the local maximum values of the excess oxygen concentration in the insulating film is the largest value of the excess oxygen concentration.

The base insulating film 102 is preferably an insulating film having a profile of excess oxygen concentration having two or more local maximum values in the depth direction. For example, the base insulating film 102 has fewer restrictions against thickening as compared to the gate insulating film 112, which enables oxygen to be more likely to be included. Further, since the base insulating film 102 is a base of the oxide semiconductor film 106, oxygen can be supplied to the oxide semiconductor film 106 from the time of formation of the oxide semiconductor film 106.

At least one of the base insulating film 102 and the gate insulating film 112 is an insulating film having a profile of excess oxygen concentration having two or more local maximum values in the depth direction. Therefore, such an insulating film has plural conditions of oxygen release. For example, in the case where oxygen is released by heat treatment, the oxygen can be released at a wide range of temperatures. Accordingly, the oxygen can be supplied to the oxide semiconductor film 106 and the vicinity of the oxide semiconductor film 106 at a wide range of temperatures.

For example, in the insulating film(s) (the base insulating film 102 and/or the gate insulating film 112) in contact with the oxide semiconductor film 106, excess oxygen in a region near the oxide semiconductor film 106 is effectively used to reduce oxygen vacancies in the vicinity of the oxide semiconductor film 106. On the other hand, excess oxygen in a region distant from the oxide semiconductor film 106 is released when higher energy is applied, and effectively used to reduce oxygen vacancies in the oxide semiconductor film 106.

The excess oxygen in at least one of the base insulating film 102 and the gate insulating film 112 is oxygen contained at the amount that exceeds the amount in the stoichiometric composition of a compound. Therefore, the excess oxygen is released when energy is applied. Film quality does not deteriorate even when the excess oxygen is released from the film.

The base insulating film 102 can be formed to have a single-layer or stacked-layer structure using one or more insulating films including the following materials: aluminum oxide, aluminum nitride, magnesium oxide, silicon oxide, silicon oxynitride, germanium oxide, yttrium oxide, zirconium oxide, lanthanum oxide, neodymium oxide, hafnium oxide, and tantalum oxide. Further, silicon nitride oxide or silicon nitride may be stacked over the single layer or the stacked layer.

In this specification, silicon oxynitride refers to a substance that contains more oxygen than nitrogen, and silicon nitride oxide refers to a substance that contains more nitrogen than oxygen.

The gate insulating film 112 can be formed to have a single-layer or stacked-layer structure using one or more insulating films including the following materials: aluminum oxide, magnesium oxide, silicon oxide, silicon oxynitride, silicon nitride oxide, silicon nitride, germanium oxide, yttrium oxide, zirconium oxide, lanthanum oxide, neodymium oxide, hafnium oxide, and tantalum oxide.

As the oxide semiconductor film 106, an In—M—Zn oxide film may be used, for example. Here, a metal element M is an element whose bond energy with oxygen is higher than that of In and that of Zn. Alternatively, M is an element which has a function of suppressing desorption of oxygen from the In—M—Zn oxide film. Owing to the effect of the metal element M, generation of oxygen vacancies in the oxide semiconductor film is suppressed to some extent. Therefore, change in electric characteristics of the transistor, which is caused by oxygen vacancies, can be reduced; accordingly, a highly reliable transistor can be obtained.

The metal element M can be, specifically, Al, Sc, Ti, V, Cr, Mn, Fe, Co, Ni, Ga, Y, Zr, Nb, Mo, Sn, La, Ce, Pr, Nd, Sm, Eu, Gd, Tb, Dy, Ho, Er, Tm, Yb, Lu, Hf, Ta, or W, and is preferably Al, Ti, Ga, Y, Zr, Ce, or Hf. As the metal element M, one or more elements of the above elements may be selected. Further, Si or Ge may be used instead of the metal element M.

Note that generation of oxygen vacancies in the oxide semiconductor film 106 cannot be completely suppressed only by the action of the metal element M included in the oxide semiconductor film 106. Therefore, it is important that oxygen is supplied from at least one of the base insulating film 102 and the gate insulating film 112.

The hydrogen concentration in the oxide semiconductor film 106 is preferably lower than or equal to $2\times10^{20}$ atoms/cm$^3$, more preferably lower than or equal to $5\times10^{19}$ atoms/cm$^3$, still more preferably lower than or equal to $1\times10^{19}$ atoms/cm$^3$. This is because hydrogen included in the oxide semiconductor film 106 generates unintentional carriers in some cases. The generated carriers are a factor of changing electric characteristics of the transistor.

The oxide semiconductor film 106 can be in a single crystal state, a polycrystalline (also referred to as polycrystal) state, an amorphous state, or the like.

The oxide semiconductor film 106 is preferably a c-axis aligned crystalline oxide semiconductor (CAAC-OS) film.

The CAAC-OS film is not completely single crystal nor completely amorphous. The CAAC-OS film is an oxide semiconductor film with a crystal-amorphous mixed phase structure where crystal portions are included in an amorphous phase. Note that in most cases, the crystal portion fits inside a cube whose one side is less than 100 nm. From an observation image obtained with a transmission electron microscope (TEM), a boundary between an amorphous portion and a crystal portion in the CAAC-OS film is not clear. Further, with the TEM, a grain boundary in the CAAC-OS film is not found. Thus, in the CAAC-OS film, a reduction in carrier mobility, due to the grain boundary, is suppressed.

In each of the crystal portions included in the CAAC-OS film, a c-axis is aligned in a direction perpendicular to a surface where the CAAC-OS film is formed or a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal portions, the directions of the a-axis and the b-axis of one crystal portion may be different from those of another crystal portion. In this specification, a simple term "perpendicular" includes a range from 85° to 95°.

In the CAAC-OS film, distribution of crystal portions is not necessarily uniform. For example, in the formation process of the CAAC-OS film, in the case where crystal growth proceeds from a surface side of the oxide semiconductor film 106, the proportion of crystal portions on the surface side of the oxide semiconductor film 106 is higher than that on the side of the surface on which the oxide semiconductor film 106 is formed in some cases. Further, when an impurity is added to the CAAC-OS film, the crystal portion in a region to which the impurity is added becomes amorphous in some cases.

Since the c-axes of the crystal portions included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal portion is the direction parallel to a normal vector of the surface where the CAAC-OS film is formed or a normal vector of the surface of the CAAC-OS film. The crystal portion is formed by film formation or by performing treatment for crystallization such as heat treatment after film formation.

In the CAAC-OS film, the bandgap is approximately 2.8 eV to 3.2 eV, the density of minority carriers is as extremely low as approximately $10^{-9}$ carriers/cm$^3$, and majority carriers flow only from a source of a transistor. Therefore, a transistor including the CAAC-OS film has no avalanche breakdown.

With the use of the CAAC-OS film in a transistor, change in electric characteristics due to irradiation with visible light or ultraviolet light is small. Thus, the transistor has high reliability.

In a transistor including the CAAC-OS film or an oxide semiconductor film with low impurity concentration and few oxygen vacancies, a channel region of the FET is fully depleted by an electric field of a gate electrode; therefore, for example, when the channel length is 3 μm and the channel width is 1 μm, the off-state current can be smaller than or equal to $10^{-23}$ A at 85° C. to 95° C. Further, the off-state current can be smaller than or equal to $10^{-25}$ A at room temperature.

There is no particular limitation on the substrate 100 as long as it has heat resistance enough to withstand heat treatment performed later. For example, a glass substrate, a ceramic substrate, a quartz substrate, or a sapphire substrate may be used as the substrate 100. Alternatively, a single crystal semiconductor substrate or a polycrystalline semiconductor substrate made of silicon, silicon carbide, or the like, a compound semiconductor substrate made of silicon germanium or the like, a silicon-on-insulator (SOI) substrate, or the like may be used as the substrate 100. Still alternatively, any of these substrates further provided with a semiconductor element may be used as the substrate 100.

In the case of using a large glass substrate such as the fifth generation (1000 mm×1200 mm or 1300 mm×1500 mm); the sixth generation (1500 mm×1800 mm); the seventh generation (1870 mm×2200 mm); the eighth generation (2200 mm×2500 mm); the ninth generation (2400 mm×2800 mm); or the tenth generation (2880 mm×3130 mm) as the substrate 100, in some cases, microfabrication is difficult due to the shrinkage of the substrate 100, which is caused by heat treatment or the like in a manufacturing process of the semiconductor device. Therefore, in the case where the above-described large glass substrate is used as the substrate 100, a substrate with small shrinkage is preferably used. For example, as the substrate 100, it is possible to use a large glass substrate in which the amount of shrinkage after heat treatment which is performed for an hour at 400° C., preferably 450° C., more preferably 500° C. is less than or equal to 10 ppm, preferably less than or equal to 5 ppm, more preferably less than or equal to 3 ppm.

Further alternatively, a flexible substrate may be used as the substrate 100. Note that as a method for forming a transistor over a flexible substrate, there is also a method in which, after a transistor is formed over a non-flexible substrate, the transistor is separated from the non-flexible substrate and transferred to the substrate 100 which is a flexible substrate. In that case, a separation layer is preferably provided between the non-flexible substrate and the transistor.

The gate electrode 104 may be formed to have a single-layer or stacked-layer structure using one or more conductive films of Al, Ti, Cr, Co, Ni, Cu, Y, Zr, Mo, Ag, Ta, and W, a nitride of any of these elements, an oxide of any of these elements, and an alloy of any of these elements.

The pair of electrodes 116 may be formed to have a single-layer or stacked-layer structure using one or more conductive films of Al, Ti, Cr, Co, Ni, Cu, Y, Zr, Mo, Ag, Ta, and W, a nitride of any of these elements, an oxide of any of these elements, and an alloy of any of these elements. In this embodiment, the pair of electrodes 116 is in contact with an upper surface of the oxide semiconductor film 106; however, an embodiment of the present invention is not limited thereto. For example, the pair of electrodes 116 may be in contact with a lower surface of the oxide semiconductor film 106.

A method for manufacturing the transistor in FIG. 1B is described below with reference to FIGS. 3A to 3C and FIGS. 4A to 4C.

Figure 3A:
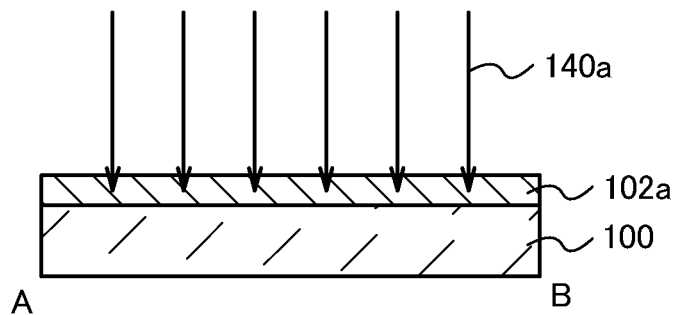
FIGS. 3A to 3C are cross-sectional views illustrating an example of a method for manufacturing a transistor according to an embodiment of the present invention.
Figure 3B:
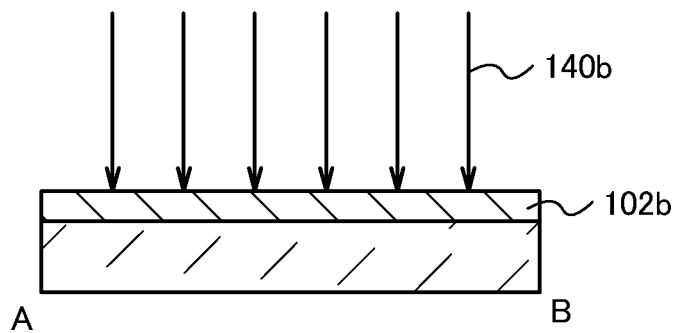
Figure 3C:
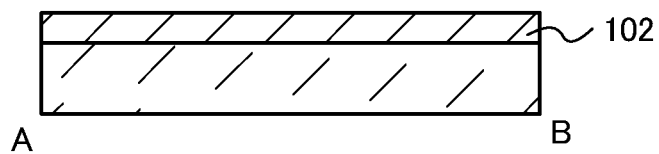

Note that FIGS. 3A to 3C illustrate a method for forming an insulating film having a profile of excess oxygen concentration having two or more local maximum values in the depth direction, as the base insulating film 102 over the substrate 100.

First, the substrate 100 is prepared.

Next, a base insulating film 102a is formed over the substrate 100. The base insulating film 102a is formed using an insulating film including any of the materials described as the materials of the base insulating film 102 by a sputtering method, a chemical vapor deposition (CVD) method, a molecular beam epitaxy (MBE) method, an atomic layer deposition (ALD) method, or a pulsed laser deposition (PLD) method.

Here, the base insulating film 102a is preferably subjected to dehydration or dehydrogenation treatment. For example, heat treatment can be performed as the dehydration or dehydrogenation treatment. The heat treatment may be performed at higher than or equal to 250° C. and lower than or equal to 650° C., preferably higher than or equal to 300° C. and lower than or equal to 500° C. The heat treatment is performed in an inert gas atmosphere, an atmosphere containing an oxidizing gas at 10 ppm or more, preferably 1% or more, further preferably 10% or more, or under reduced pressure. Alternatively, the heat treatment may be performed in such a manner that heat treatment is performed in an inert gas atmosphere, and then another heat treatment is performed in an atmosphere containing an oxidizing gas at 10 ppm or more, preferably 1% or more, further preferably 10% or more in order to compensate oxygen which is desorbed. Alternatively, plasma treatment, UV treatment, or chemical treatment may be performed as the dehydration or dehydrogenation treatment.

Next, oxygen 140a is added to the base insulating film 102a from an upper surface side under a first condition (see FIG. 3A). The oxygen 140a may be added by an ion implantation method or an ion doping method. In that case, the acceleration voltage is set to higher than or equal to 10 kV and lower than or equal to 100 kV. Further, the amount of the oxygen 140a added is set to larger than or equal to $1 \times 10^{14}$ ions/cm$^2$ and smaller than or equal to $1 \times 10^{16}$ ions/cm$^2$.

The oxygen 140a is added to the base insulating film 102a, whereby a base insulating film 102b is formed.

Next, oxygen 140b is added to the base insulating film 102b from an upper surface side under a second condition (see FIG. 3B). The oxygen 140b may be added by an ion implantation method or an ion doping method. In that case, the acceleration voltage is set to higher than or equal to 1 kV and lower than 10 kV. Further, the amount of the oxygen 140b added is set to larger than or equal to $1 \times 10^{14}$ ions/cm$^2$ and smaller than or equal to $1 \times 10^{16}$ ions/cm$^2$.

Alternatively, the oxygen 140b may be added in such a manner that bias voltage is applied to the substrate side in plasma including oxygen. In that case, the bias voltage is set to higher than or equal to 10 V and lower than 1 kV. Further, the application time of the bias voltage may be set to longer than or equal to 10 seconds and shorter than or equal to 1000 seconds, preferably longer than or equal to 10 seconds and shorter than or equal to 200 seconds, further preferably longer than or equal to 10 seconds and shorter than or equal to 60 seconds. As the bias voltage is higher and the application time of the bias voltage is longer, oxygen can be added more; however, the film is etched more.

The oxygen 140b is added to the base insulating film 102b, whereby the base insulating film 102 is formed (see FIG. 3C).

Further, in addition to the first condition and the second condition, oxygen may be added under third to n-th conditions (n is a natural number of 4 or larger).

The first condition and the second condition may be replaced with each other. Note that it is preferable that the depth at which oxygen is implanted under the first condition be deeper than that at which oxygen is implanted under the second condition. This is for the prevention of interference between oxygen added under the first condition and oxygen added under the second condition. This also applies to the case where oxygen is added n times; it is preferable that the depth at which oxygen is implanted be shallower in order of oxygen addition.

Thus, the base insulating film 102 including the excess oxygen may be formed. Note that this embodiment is not limited to the case where the base insulating film 102 includes the excess oxygen. In the case where the gate insulating film 112 described later includes excess oxygen, the base insulating film 102 does not necessarily include excess oxygen in some cases.

Since the base insulating film 102 preferably has sufficient planarity, the base insulating film 102 may be subjected to planarization treatment. As the planarization treatment, chemical mechanical polishing (CMP) treatment or a dry etching method may be used. Specifically, the base insulating film 102 is provided so as to have an average surface roughness (Ra) less than or equal to 1 nm, preferably less than or equal to 0.3 nm, more preferably less than or equal to 0.1 nm. When Ra is less than or equal to the above value, a crystal region is easily formed in the oxide semiconductor film 106. Further, when the degree of roughness at the interface between the base insulating film 102 and the oxide semiconductor film 106 is small, the influence of interface scattering can be reduced. Note that Ra is obtained by expanding, into three dimensions, arithmetic mean surface roughness that is defined by JIS B 0601: 2001 (ISO4287:1997) so as to be able to apply it to a curved surface. Ra can be expressed as an "average value of the absolute values of deviations from a reference surface to a specific surface" and is defined by Formula 1.

$$Ra = \frac{1}{S_0} \int_{y1}^{y2} \int_{x1}^{x2} |f(x, y) - Z_0| dx dy \quad \text{[Formula 1]}$$

Here, the specific surface is a surface which is a target of roughness measurement, and is a quadrilateral region which is specified by four points represented by the coordinates $(x_1, y_1, f(x_1, y_1))$, $(x_1, y_2, f(x_1, y_2))$, $(x_2, y_1, f(x_2, y_1))$, and $(x_2, y_2, f(x_2, y_2))$. $S_0$ represents the area of a rectangle which is obtained by projecting the specific surface on the xy plane, and $Z_0$ represents the height of the reference surface (the average height of the specific surface). Ra can be measured using an atomic force microscope (AFM).

Next, an oxide semiconductor film is formed. The oxide semiconductor film is formed using an oxide film selected from any of the oxide films described as the oxide films used as the oxide semiconductor film 106 by a sputtering method, a CVD method, an MBE method, an ALD method, or a PLD method. The oxide semiconductor film is preferably formed by a sputtering method. At this time, a deposition gas is used which includes an oxidizing gas at 5% or more, preferably 10% or more, further preferably 20% or more, still further preferably 50% or more. As the deposition gas, a gas in which the concentration of impurities such as hydrogen is low is used.

After the deposition of the oxide semiconductor film, first heat treatment may be performed. The first heat treatment may be performed at higher than or equal to 250° C. and lower than or equal to 650° C., preferably higher than or equal to 300° C. and lower than or equal to 500° C. The first heat treatment is performed in an inert gas atmosphere, an atmosphere containing an oxidizing gas at 10 ppm or more, preferably 1% or more, further preferably 10% or more, or under reduced pressure. Alternatively, the first heat treatment may be performed in such a manner that heat treatment is performed in an inert gas atmosphere, and then another heat treatment is performed in an atmosphere containing an oxidizing gas at 10 ppm or more, preferably 1% or more, further preferably 10% or more in order to compensate oxygen which is desorbed. By the first heat treatment, impurities such as hydrogen and water can be removed from the oxide semiconductor film.

Figure 4A:
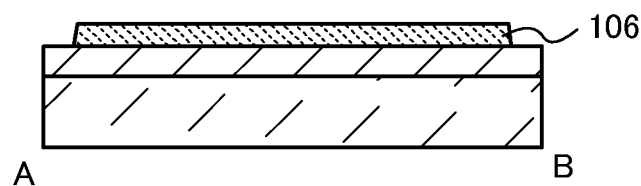
FIGS. 4A to 4C are cross-sectional views illustrating an example of a method for manufacturing a transistor according to an embodiment of the present invention.
Figure 4B:
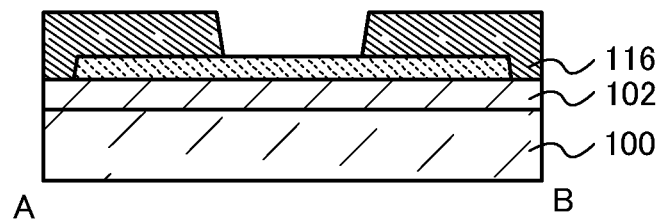
Figure 4C:
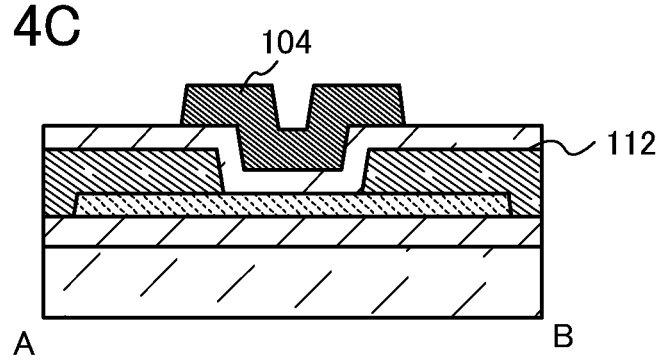

Next, the oxide semiconductor film is processed to have an island shape; thus, the oxide semiconductor film 106 is formed (see FIG. 4A).

Next, a conductive film to be the pair of electrodes 116 is formed. The conductive film to be the pair of electrodes 116 is formed using any of the materials described as the materials used for the pair of electrodes 116 by a sputtering method, a CVD method, an MBE method, an ALD method, or a PLD method. Then, the conductive film to be the pair of electrodes 116 is processed into the pair of electrodes 116 (see FIG. 4B).

Next, the gate insulating film 112 is formed. The gate insulating film 112 may be formed using an insulating film including any of the materials described as the materials used for the gate insulating film 112 by a sputtering method, a CVD method, an MBE method, an ALD method, or a PLD method.

Here, the gate insulating film 112 is preferably subjected to dehydration or dehydrogenation treatment. Refer to the method for performing the dehydration or dehydrogenation treatment on the base insulating film 102a therefor.

In the case where an insulating film having a profile of excess oxygen concentration having two or more local maximum values in the depth direction is used as the gate insulating film 112, the excess oxygen may be included in accordance with the method illustrated in FIGS. 3A to 3C.

Then, a conductive film to be the gate electrode 104 is formed. The conductive film to be the gate electrode 104 is formed using any of the conductive films described as the conductive films used as the gate electrode 104 by a sputtering method, a CVD method, an MBE method, an ALD method, or a PLD method. After that, the conductive film to be the gate electrode 104 is processed, whereby the gate electrode 104 is formed (see FIG. 4C).

After formation of the gate electrode 104, second heat treatment is performed. The excess oxygen can be released from the base insulating film 102 and/or the gate insulating film 112 by the second heat treatment. The released excess oxygen is supplied to the oxide semiconductor film 106 and the vicinity of the oxide semiconductor film 106; thus, oxygen vacancies can be reduced. The second heat treatment can be performed under a condition similar to that of the first heat treatment.

The timing of the second heat treatment is not limited to being after formation of the gate electrode 104. For example, the second heat treatment may be performed after formation of a protective insulating film over the gate electrode 104.

In this manner, the transistor in FIG. 1B can be manufactured.

The transistor in FIG. 1B has few oxygen vacancies in the oxide semiconductor film 106 and the vicinity of the oxide semiconductor film 106 and excellent electric characteristics. In addition, since change in electric characteristics due to operation of the transistor is suppressed, reliability of a semiconductor device including the transistor can be increased.

Figure 2A:
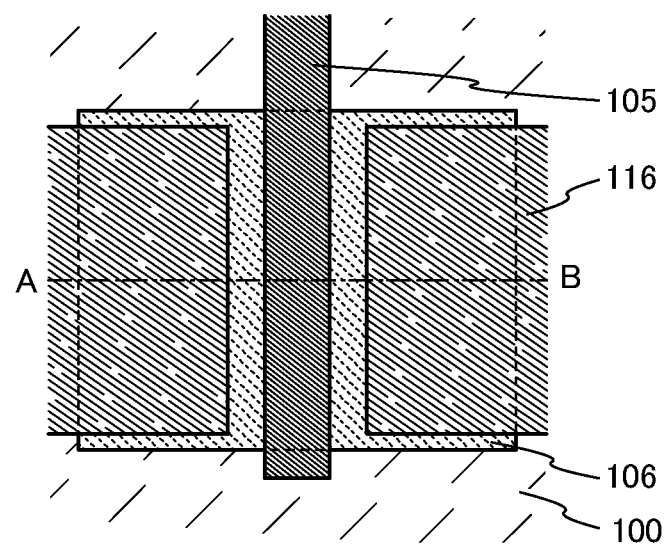
FIGS. 2A and 2B are a top view and a cross-sectional view illustrating an example of a transistor according to an embodiment of the present invention.
Figure 2B:
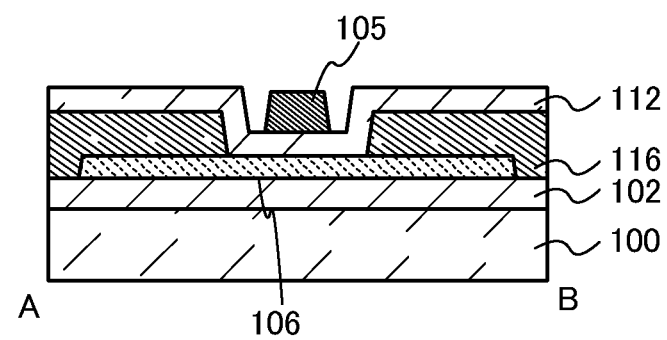

FIGS. 2A and 2B illustrate a transistor according to an embodiment of the present invention, which is different from the transistor of FIGS. 1A and 1B. FIG. 2A is a top view. FIG. 2B is a cross-sectional view along dashed-dotted line A-B in FIG. 2A. Note that for simplicity, the gate insulating film 112, the base insulating film 102, and the like are not shown in FIG. 2A.

The transistor in FIG. 2B includes the base insulating film 102 provided over the substrate 100, the oxide semiconductor film 106 provided over the base insulating film 102, the pair of electrodes 116 provided over the oxide semiconductor film 106, the gate insulating film 112 provided over the oxide semiconductor film 106 and the pair of electrodes 116, and a gate electrode 105 provided to overlap with the oxide semiconductor film 106 with the gate insulating film 112 provided therebetween and not to overlap with the pair of electrodes 116.

The transistor in FIG. 2B has a structure similar to that of the transistor in FIG. 1B except for the shape of the gate electrode. Therefore, the description regarding FIGS. 1A and 1B is referred to for details other than the shape of the gate electrode.

In the transistor in FIG. 2B, the pair of electrodes 116 does not overlap with the gate electrode 105. Accordingly, a region of the oxide semiconductor film 106, which overlaps with the gate electrode 105, is a channel region. An offset region or a lightly doped drain (LDD) region is provided between the channel formation region of the oxide semiconductor film 106 and each of the pair of electrodes 116. With the offset region or the LDD region, concentration of an electric field in the vicinity of the channel region can be relieved, and deterioration of electric characteristics of the transistor, due to hot carriers, can be suppressed. Thus, a highly reliable transistor can be obtained.

Note that an impurity which reduces the resistance of the oxide semiconductor film may be added to the transistor in FIG. 2B from an upper surface side in order to form an LDD region. As the impurity added to reduce the resistance of the oxide semiconductor film, specifically, one or more of helium, boron, nitrogen, fluorine, neon, aluminum, phosphorus, argon, arsenic, krypton, indium, tin, antimony, and xenon may be used. The method for adding the impurity may be an ion implantation method or an ion doping method. After that, heat treatment may be performed.

According to this embodiment, a transistor with excellent electric characteristics can be provided. Further, a highly reliable semiconductor device including the transistor can be provided.

This embodiment can be combined with any of the other embodiments as appropriate.

Embodiment 2

In this embodiment, a transistor having a structure different from the structures of the transistors in Embodiment 1 will be described with reference to FIGS. 5A to 5C, FIGS. 6A to 6C, and FIGS. 7A to 7C.

Figure 5A:
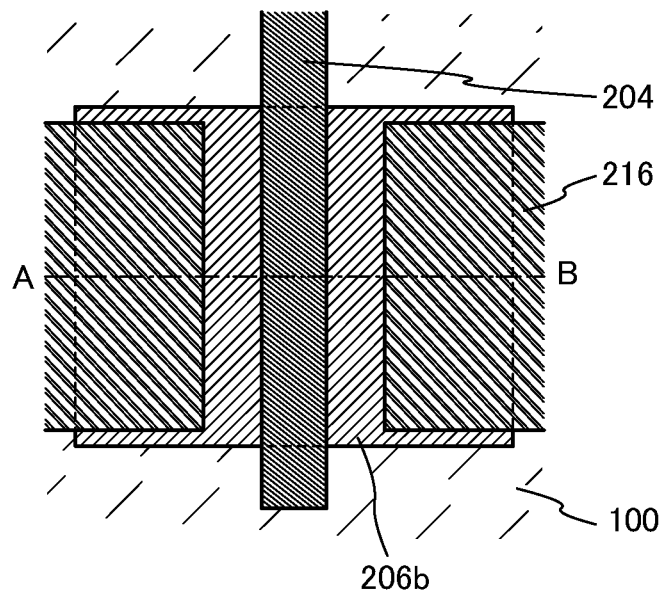
FIGS. 5A to 5C are a top view and cross-sectional views illustrating examples of transistors according to embodiments of the present invention.
Figure 5B:
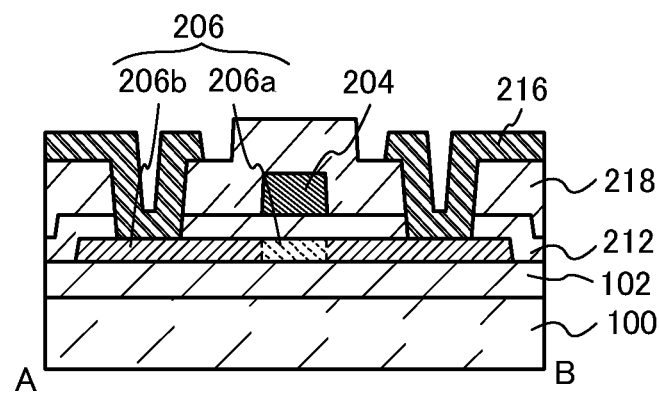

FIG. 5A is a top view of a transistor according to an embodiment of the present invention. FIG. 5B is a cross-sectional view along dashed-dotted line A-B in FIG. 5A. Note that for simplicity, a protective insulating film 218, the base insulating film 102, and the like are not shown in FIG. 5A.

The transistor in FIG. 5B includes the base insulating film 102 provided over the substrate 100, an oxide semiconductor film 206 provided over the base insulating film 102 and including a first region 206a and second regions 206b, a gate insulating film 212 provided over the oxide semiconductor film 206, a gate electrode 204 provided to overlap with the oxide semiconductor film 206 with the gate insulating film 212 interposed therebetween, the protective insulating film 218 provided over the gate electrode 204 and the oxide semiconductor film 206 and having opening portions reaching the oxide semiconductor film 206, and a pair of electrodes 216 provided in contact with the second regions 206b of the oxide semiconductor film 206 through the opening portions in the protective insulating film 218. Note that the first region 206a of the oxide semiconductor film 206 is provided to overlap with the gate electrode 204.

Note that similarly to Embodiment 1, at least one of the base insulating film 102 and the gate insulating film 212 is an insulating film having a profile of excess oxygen concentration having two or more local maximum values in the depth direction.

The first region 206a of the oxide semiconductor film 206 serves as a channel region of the transistor. Further, the second regions 206b of the oxide semiconductor film 206 serve as a source region and a drain region of the transistor.

The description in Embodiment 1 is referred to for the substrate 100 and the base insulating film 102.

The gate electrode 204 may be formed using a conductive film similar to that of the gate electrode 104.

The gate insulating film 212 may be formed using an insulating film similar to that of the gate insulating film 112.

Although a structure in which a sidewall insulating film is not provided is described in this embodiment, the structure is not limited thereto. For example, a sidewall insulating film in contact with a side surface of the gate electrode 204 may be provided.

Figure 5C:
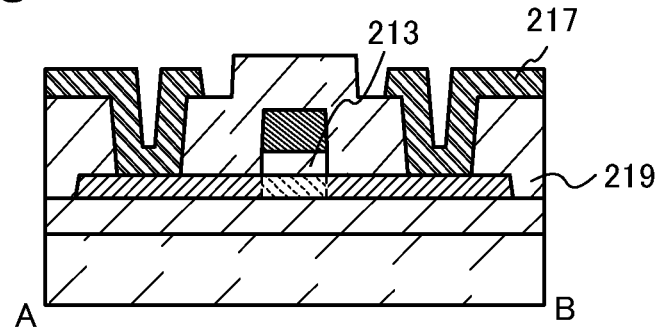

Note that the transistor in FIG. 5C is similar to the transistor in FIG. 5B except that in a top view, the shape of the gate insulating film is similar to that of the gate electrode 204. Therefore, description of the transistor in FIG. 5B is referred to for the transistor in FIG. 5C.

The oxide semiconductor film 206 may be formed using an oxide film similar to that of the oxide semiconductor film 106.

The protective insulating film 218 can be formed to have a single-layer or stacked-layer structure using one or more insulating films including the following materials: aluminum oxide, aluminum nitride, magnesium oxide, silicon oxide, silicon oxynitride, silicon nitride oxide, silicon nitride, germanium oxide, yttrium oxide, zirconium oxide, lanthanum oxide, neodymium oxide, hafnium oxide, and tantalum oxide.

It is preferable that the protective insulating film 218 have low relative permittivity and a sufficient thickness. For example, a silicon oxide film having a relative permittivity of approximately 3.8 and a thickness of greater than or equal to 200 nm and less than or equal to 1000 nm may be provided. A surface of the protective insulating film 218 has a little fixed charge because of the influence of atmospheric components and the like, which might cause the shift of the threshold voltage of the transistor. Therefore, it is preferable that the protective insulating film 218 have relative permittivity and a thickness such that the influence of the charge at the surface is sufficiently reduced. For the same reason, a resin film may be formed over the protective insulating film 218 to reduce the influence of the charge at the surface.

The pair of electrodes 216 may be formed using a conductive film similar to that of the pair of electrodes 116.

A method for manufacturing the transistor in FIG. 5B is described below with reference to FIGS. 6A to 6C and FIGS. 7A to 7C.

Figure 6A:
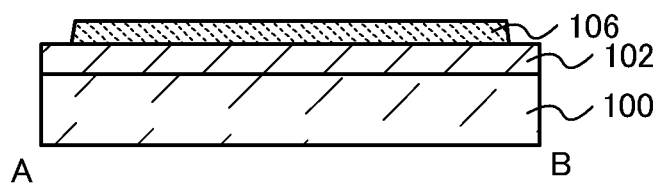
FIGS. 6A to 6C are cross-sectional views illustrating an example of a method for manufacturing a transistor according to an embodiment of the present invention.

Note that Embodiment 1 is referred to for the manufacturing method up to the steps of forming the base insulating film 102 over the substrate 100 and forming the oxide semiconductor film 106 over the base insulating film 102, which are shown in FIG. 6A.

Next, the gate insulating film 212 is formed. The gate insulating film 212 may be formed by a method similar to that of the gate insulating film 112.

Here, the gate insulating film 212 is preferably subjected to dehydration or dehydrogenation treatment. Embodiment 1 is referred to for the dehydration or dehydrogenation treatment.

In the case where an insulating film having a profile of excess oxygen concentration having two or more local maximum values in the depth direction is used as the gate insulating film 212, the excess oxygen may be included in accordance with the method illustrated in FIGS. 3A to 3C.

Figure 6B:
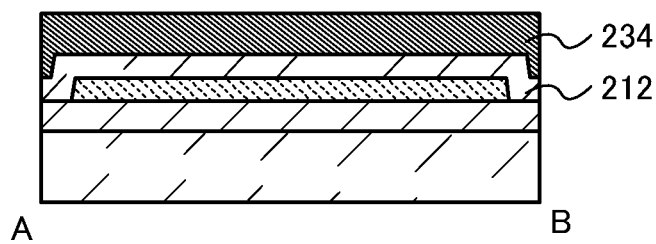

Then, a conductive film 234 is formed (see FIG. 6B). The conductive film 234 can be deposited by a sputtering method, a CVD method, an MBE method, an ALD method, or a PLD method.

Next, second heat treatment is performed. The description of the heat treatment in Embodiment 1 can be referred to for the second heat treatment.

Figure 6C:
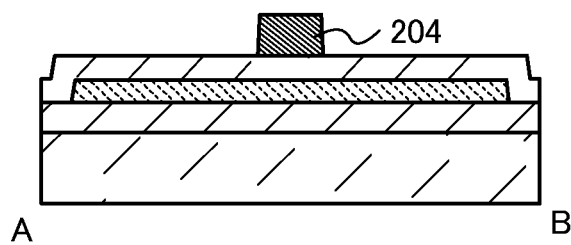

Next, the conductive film 234 is processed, so that the gate electrode 204 is formed (see FIG. 6C).

In order to manufacture the transistor in FIG. 5C, next, the gate insulating film 212 is processed, so that a gate insulating film 213 having a shape similar to that of the gate electrode 204 in a top view may be formed. Note that the gate insulating film 212 may be processed with the use of a resist mask used for processing the gate electrode 204, or the gate insulating film 212 may be processed with the use of the gate electrode 204 as a mask after the resist mask is removed.

Next, a sidewall insulating film may be formed. First, an insulating film to be the sidewall insulating film is formed. The insulating film to be the sidewall insulating film may be formed by a sputtering method, a CVD method, an MBE method, an ALD method, or a PLD method. Then, highly anisotropic etching treatment is performed on the insulating film to be the sidewall insulating film, whereby the sidewall insulating film in contact with a side surface of the gate electrode 204 can be formed. In the case where a sidewall insulating film is provided in the transistor in FIG. 5C, the sidewall insulating film is in contact with side surfaces of the gate insulating film 213 and the gate electrode 204.

Note that the insulating film to be the sidewall insulating film may be formed using one or more insulating films including the following materials: aluminum oxide, aluminum nitride, magnesium oxide, silicon oxide, silicon oxynitride, silicon nitride oxide, silicon nitride, germanium oxide, yttrium oxide, zirconium oxide, lanthanum oxide, neodymium oxide, hafnium oxide, and tantalum oxide.

Next, an impurity for reducing the resistance of the oxide semiconductor film is added to the oxide semiconductor film 106 with the use of the gate electrode 204 as a mask. Specifically, one or more of helium, boron, nitrogen, fluorine, neon, aluminum, phosphorus, argon, arsenic, krypton, indium, tin, antimony, and xenon may be added. The method for adding the impurity may be an ion implantation method or an ion doping method. An ion implantation method is preferably used. Further, after the impurity for reducing the resistance of the oxide semiconductor film is added by an ion implantation method, heat treatment may be performed.

The resistance of the regions to which the impurity is added is reduced, and the regions become the second regions 206b. A region to which the impurity is not added becomes the first region 206a. Thus, the oxide semiconductor film 206 including the first region 206a and the second regions 206b is formed (see FIG. 7A).

In the case where a sidewall insulating film is provided in contact with the gate electrode 204, the impurity is not added also to a region overlapping with the sidewall insulating film. Therefore, the first region 206a is formed in a region overlapping with the gate electrode 204 and the sidewall insulating film.

Then, the protective insulating film 218 is formed over the gate insulating film 212 and the gate electrode 204. The protective insulating film 218 is preferably formed using any of the insulating films described as the insulating films used as the protective insulating film 218 by a sputtering method, a CVD method, an MBE method, an ALD method, or a PLD method.

Then, the protective insulating film 218 and the gate insulating film 212 are processed, so that a pair of opening portions exposing the second regions 206b of the oxide semiconductor film 206 is formed. The formation of the opening portions is performed in conditions which prevent etching of the oxide semiconductor film 206 as much as possible. However, an embodiment of the present invention is not limited thereto. Specifically, when the openings are formed, parts of surfaces of the second regions 206b of the oxide semiconductor film 206 may be etched, or the openings may penetrate the second regions 206b to expose the base insulating film 102.

Next, over the protective insulating film 218 and the exposed oxide semiconductor film 206, a conductive film to be the pair of electrodes 216 is deposited. The conductive film is preferably formed using any of the conductive films described as the conductive films used for the pair of electrodes 216 by a sputtering method, a CVD method, an MBE method, an ALD method, or a PLD method.

Figure 7A:
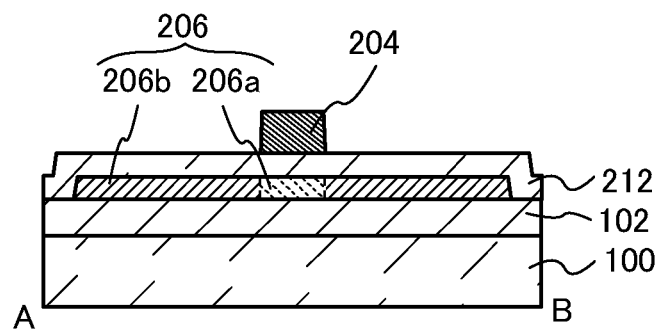
FIGS. 7A to 7C are cross-sectional views illustrating an example of a method for manufacturing a transistor according to an embodiment of the present invention.
Figure 7B:
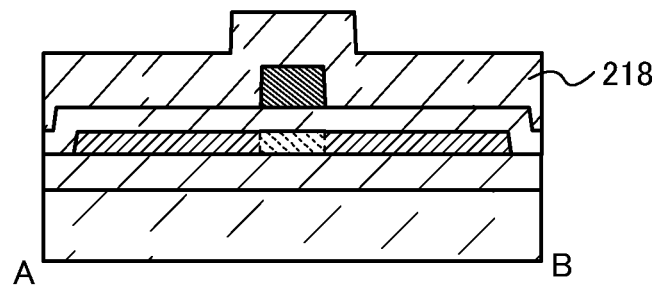
Figure 7C:
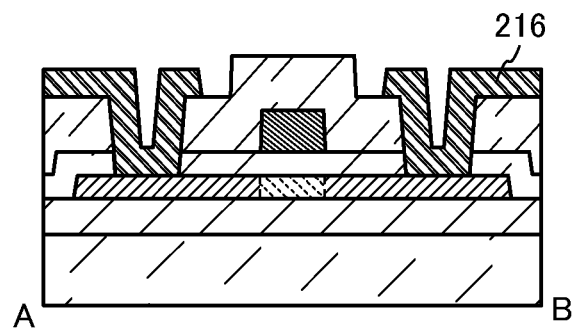

Next, the conductive film to be the pair of electrodes 216 is processed into the pair of electrodes 216 (see FIG. 7C).

In this manner, the transistor illustrated in FIG. 5B can be manufactured.

The transistor in FIG. 5B has few oxygen vacancies in the oxide semiconductor film 206 and the vicinity of the oxide semiconductor film 206 and excellent electric characteristics. In addition, since change in electric characteristics due to operation of the transistor is suppressed, reliability of a semiconductor device including the transistor can be increased.

According to this embodiment, a transistor with excellent electric characteristics can be provided. Further, a highly reliable semiconductor device including the transistor can be provided.

This embodiment can be combined with any of the other embodiments as appropriate.

Embodiment 3

In this embodiment, a transistor having a structure different from those of the transistors in Embodiments 1 and 2 will be described with reference to FIGS. 8A and 8B, FIGS. 9A to 9C, FIGS. 10A to 10C, and FIGS. 11A to 11C.

Figure 8A:
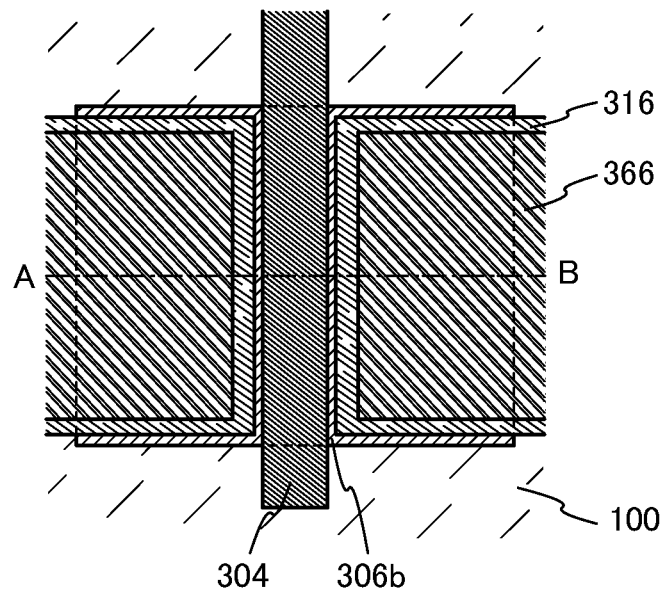
FIGS. 8A and 8B are a top view and a cross-sectional view illustrating an example of a transistor according to an embodiment of the present invention.
Figure 8B:
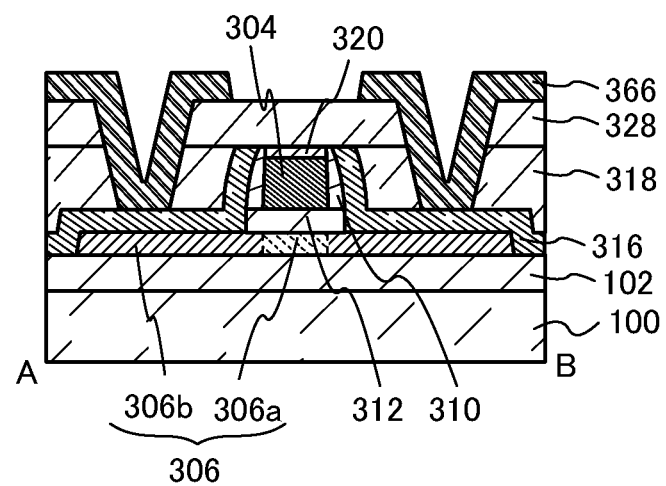

FIG. 8A is a top view of a transistor according to an embodiment of the present invention. FIG. 8B is a cross-sectional view along dashed-dotted line A-B in FIG. 8A. Note that for simplicity, a protective insulating film 328, a protective insulating film 318, a gate insulating film 312, sidewall insulating films 310, the base insulating film 102, and the like are not shown in FIG. 8A.

The transistor in FIG. 8B includes the base insulating film 102 provided over the substrate 100, an oxide semiconductor film 306 provided over the base insulating film 102 and including a first region 306a and second regions 306b, the gate insulating film 312 provided over the oxide semiconductor film 306, a gate electrode 304 provided over the oxide semiconductor film 306 with the gate insulating film 312 interposed therebetween, an insulating film 320 provided over the gate electrode 304, the sidewall insulating films 310 provided in contact with side surfaces of the gate electrode 304 and the insulating film 320, a pair of electrodes 316 provided over the oxide semiconductor film 306 and in contact with the second regions 306b of the oxide semiconductor film 306 and the sidewall insulating films 310, the protective insulating film 318 provided over the pair of electrodes 316 and having an upper surface aligned with an upper surface of the insulating film 320, and the protective insulating film 328 provided over the protective insulating film 318 and the insulating film 320. Opening portions reaching the pair of electrodes 316 are provided in the protective insulating film 318 and the protective insulating film 328. Wirings 366 are provided in contact with the pair of electrodes 316 in the opening portions.

Note that similarly to Embodiments 1 and 2, at least one of the base insulating film 102 and the gate insulating film 312 is an insulating film having a profile of excess oxygen concentration having two or more local maximum values in the depth direction.

In the transistor in FIG. 8B, the shape of the gate electrode 304 is similar to that of the insulating film 320 in a top view. Further, the shape of the gate insulating film 312 is similar to that of a region overlapping with the gate electrode 304 and the sidewall insulating films 310 in a top view.

The first region 306a of the oxide semiconductor film 306 serves as a channel region of the transistor. In the second regions of the oxide semiconductor film 306, regions overlapping with the sidewall insulating films 310 serve as LDD regions. Therefore, the length of the LDD regions can be easily controlled. Regions in the second regions 306b of the oxide semiconductor film 306, which are in contact with the pair of electrodes 316, serve as a source region and a drain region of the transistor.

In the transistor in FIG. 8B, the pair of electrodes 316 is provided close to the gate electrode 304 with the sidewall insulating films 310 interposed therebetween.

With the LDD regions, concentration of an electric field in the vicinity of the channel region can be relieved, and deterioration of electric characteristics of the transistor, due to hot carriers, can be suppressed. Thus, a highly reliable transistor can be obtained.

The description in Embodiment 1 is referred to for the substrate 100 and the base insulating film 102.

The gate electrode 304 may be formed using a conductive film similar to that of the gate electrode 104.

The gate insulating film 312 may be formed using an insulating film similar to that of the gate insulating film 112.

The oxide semiconductor film 306 may be formed using an oxide film similar to that of the oxide semiconductor film 106.

The sidewall insulating films 310 can be formed using one or more of insulating films containing any of aluminum oxide, aluminum nitride, magnesium oxide, silicon oxide, silicon oxynitride, silicon nitride oxide, silicon nitride, germanium oxide, yttrium oxide, zirconium oxide, lanthanum oxide, neodymium oxide, hafnium oxide, and tantalum oxide.

The insulating film 320 may be formed using one or more of insulating films containing any of aluminum oxide, aluminum nitride, magnesium oxide, silicon oxide, silicon oxynitride, silicon nitride oxide, silicon nitride, germanium oxide, yttrium oxide, zirconium oxide, lanthanum oxide, neodymium oxide, hafnium oxide, and tantalum oxide.

The pair of electrodes 316 may be formed using a conductive film similar to that of the pair of electrodes 116.

The protective insulating film 318 may be formed using an insulating film similar to that of the protective insulating film 218.

The protective insulating film 328 may be formed using an insulating film similar to that of the protective insulating film 218.

The wirings 366 may be formed to have a single-layer or stacked-layer structure using one or more of Al, Ti, Cr, Co, Ni, Cu, Y, Zr, Mo, Ag, Ta, and W, a nitride of any of these elements, an oxide of any of these elements, and an alloy of any of these elements.

A method for manufacturing the transistor in FIG. 8B is described below with reference to FIGS. 9A to 9C, FIGS. 10A to 10C, and FIGS. 11A to 11C.

Figure 9A:
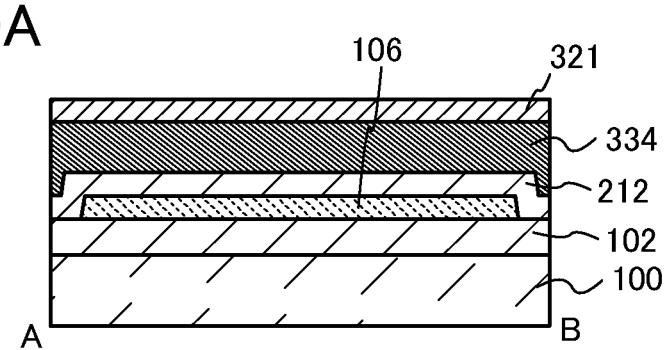
FIGS. 9A to 9C are cross-sectional views illustrating an example of a method for manufacturing a transistor according to an embodiment of the present invention.

Note that Embodiments 1 and 2 are referred to for the manufacturing method up to the steps of forming the base insulating film 102 over the substrate 100, forming the oxide semiconductor film 106 over the base insulating film 102, and forming the gate insulating film 212 over the oxide semiconductor film 106, which are shown in FIG. 9A.

Then, a conductive film 334 is formed. The conductive film 334 is formed using any of the conductive films described as the conductive films used as the gate electrode 304 by a sputtering method, a CVD method, an MBE method, an ALD method, or a PLD method.

Next, an insulating film 321 is formed (see FIG. 9A). The insulating film 321 may be formed using any of the insulating films described as the insulating film 320 by a sputtering method, a CVD method, an MBE method, an ALD method, or a PLD method.

Figure 9B:
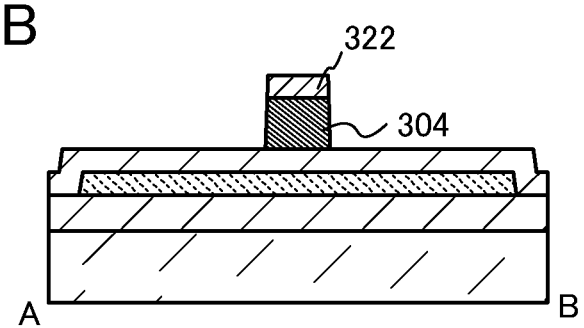
Figure 9C:
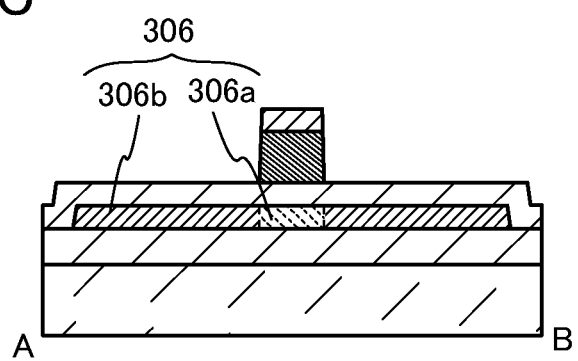

Next, the insulating film 321 and the conductive film 334 are processed to form an insulating film 322 and the gate electrode 304 having similar shapes in a top view (see FIG. 9B).

Next, an impurity for reducing the resistance of the oxide semiconductor film is added to the oxide semiconductor film 106 with the use of the insulating film 322 and the gate electrode 304 as masks. Specifically, one or more of helium, boron, nitrogen, fluorine, neon, aluminum, phosphorus, argon, arsenic, krypton, indium, tin, antimony, and xenon may be added. The method for adding the impurity may be an ion implantation method or an ion doping method. An ion implantation method is preferably used. Further, after the impurity for reducing the resistance of the oxide semiconductor film is added by an ion implantation method, heat treatment may be performed.

The resistance of the regions to which the impurity is added is reduced, and the regions become the second regions 306$b$. A region to which the impurity is not added becomes the first region 306$a$. Thus, the oxide semiconductor film 306 including the first region 306$a$ and the second regions 306$b$ is formed (see FIG. 9C).

Next, an insulating film to be sidewall insulating films 311 is formed. The insulating film to be the sidewall insulating films 311 can be formed using an insulating film selected from the insulating films which can be used for the sidewall insulating films 310 by a sputtering method, a CVD method, an MBE method, an ALD method, or a PLD method. Then, highly anisotropic etching treatment is performed on the insulating film to be the sidewall insulating films 311, whereby the sidewall insulating films 311 which are in contact with side surfaces of the insulating film 322 and the gate electrode 304 can be formed.

Figure 10A:
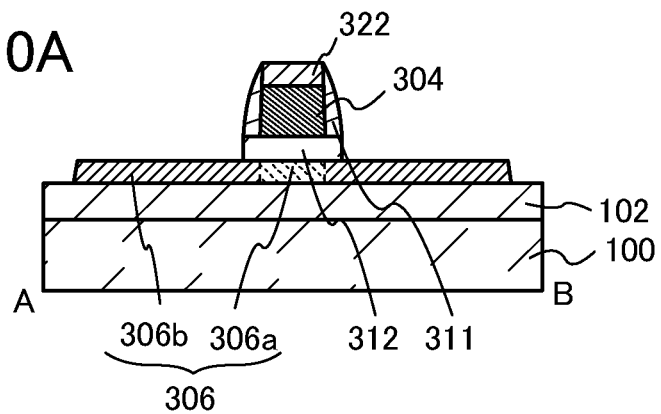
FIGS. 10A to 10C are cross-sectional views illustrating an example of a method for manufacturing a transistor according to an embodiment of the present invention.

In the same step as the step of forming the sidewall insulating films 311, the gate insulating film 212 is processed with the use of the sidewall insulating films 311 and the gate electrode 304 as masks, so that the gate insulating film 312 is formed (see FIG. 10A).

Figure 10B:
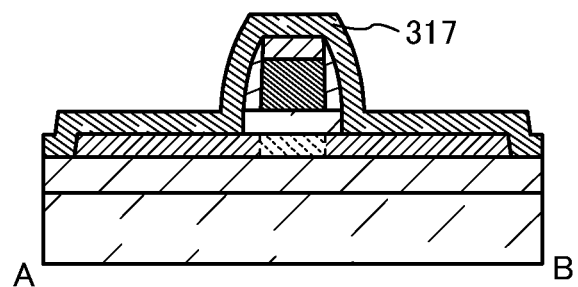

Next, a conductive film 317 is formed (see FIG. 10B). The conductive film 317 can be formed using any of the conductive films described as the conductive film used for the pair of electrodes 316 by a sputtering method, a CVD method, an MBE method, an ALD method, or a PLD method.

After formation of the conductive film 317, second heat treatment is performed. The excess oxygen can be released from the base insulating film 102 and/or the gate insulating film 312 by the second heat treatment. The released excess oxygen is supplied to the oxide semiconductor film 306 and the vicinity of the oxide semiconductor film 306; thus, oxygen vacancies can be reduced. The second heat treatment can be performed under a condition similar to that of the second heat treatment in Embodiment 1.

The timing of the second heat treatment is not limited to being after formation of the conductive film 317; the second heat treatment can be performed anytime after formation of the conductive film 317.

Figure 10C:
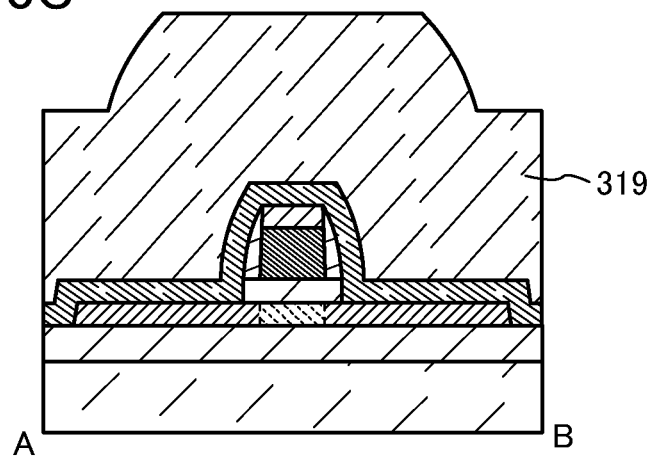

Then, the protective insulating film 319 is formed (see FIG. 10C). The protective insulating film 319 is preferably formed using any of the insulating films described as the insulating films used as the protective insulating film 318 by a sputtering method, a CVD method, an MBE method, an ALD method, or a PLD method.

Figure 11A:
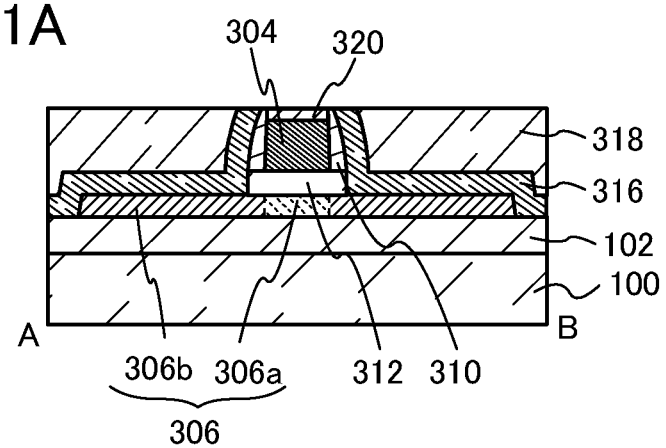
FIGS. 11A to 11C are cross-sectional views illustrating an example of a method for manufacturing a transistor according to an embodiment of the present invention.

Next, planarization treatment (e.g., CMP treatment or dry etching treatment) is performed from the upper surface side of the protective insulating film 319, whereby the pair of electrodes 316, the sidewall insulating films 310, the protective insulating film 318, and the insulating film 320 are formed (see FIG. 11A).

By the planarization treatment from the upper surface side of the protective insulating film 319, only a region of the conductive film 317, which overlaps with the insulating film 322 (gate electrode 304), can be removed. At this time, the insulating film 322 is also subjected to the planarization treatment to be the insulating film 320 with reduced thickness.

The pair of electrodes 316 is formed in such a manner, whereby the pair of electrodes 316 can be provided close to the gate electrode 304 with the sidewall insulating films 310 interposed therebetween.

Figure 11B:
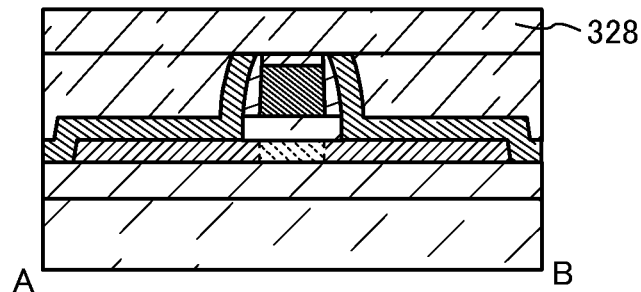

Then, the protective insulating film 328 is formed (see FIG. 11B). The protective insulating film 328 is preferably formed using any of the insulating films described as the insulating films used as the protective insulating film 328 by a sputtering method, a CVD method, an MBE method, an ALD method, or a PLD method.

Next, the protective insulating film 328 and the protective insulating film 318 are processed, so that opening portions exposing the pair of electrodes 316 are formed.

Then, a conductive film to be the wirings 366 is formed. The conductive film to be the wirings 366 is formed using any of the elements described as the elements used for the wirings 366 by a sputtering method, a CVD method, an MBE method, an ALD method, or a PLD method.

Figure 11C:
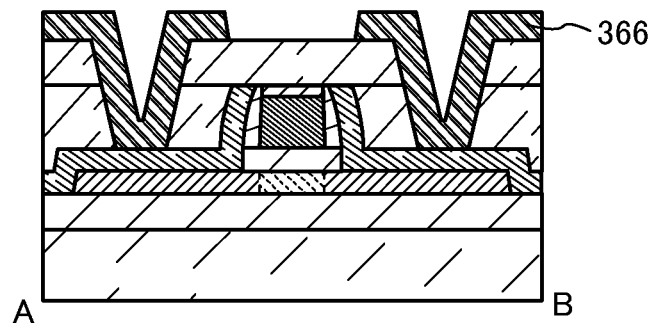

Next, the conductive film to be the wirings 366 is processed, whereby the wirings 366 in contact with the pair of electrodes 316 in the opening portions provided in the protective insulating film 328 and the protective insulating film 318 are formed (see FIG. 11C).

In this manner, the transistor illustrated in FIG. 8B can be manufactured.

The transistor in FIG. 8B has few oxygen vacancies in the oxide semiconductor film 306 and the vicinity of the oxide semiconductor film 306 and excellent electric characteristics. In addition, since change in electric characteristics due to operation of the transistor is suppressed, reliability of a semiconductor device including the transistor can be increased.

Since the transistor in FIG. 8B includes the LDD regions, concentration of an electric field in the vicinity of the channel region can be relieved, and deterioration of electric characteristics of the transistor, due to hot carriers, can be suppressed. Thus, a highly reliable transistor can be obtained.

According to this embodiment, a transistor with excellent electric characteristics can be provided. Further, a highly reliable semiconductor device including the transistor can be provided.

This embodiment can be combined with any of the other embodiments as appropriate.

Embodiment 4

In this embodiment, a transistor according to an embodiment of the present invention will be described with reference to FIGS. 12A and 12B, FIGS. 13A to 13C, and FIGS. 14A to 14C.

Figure 12A:
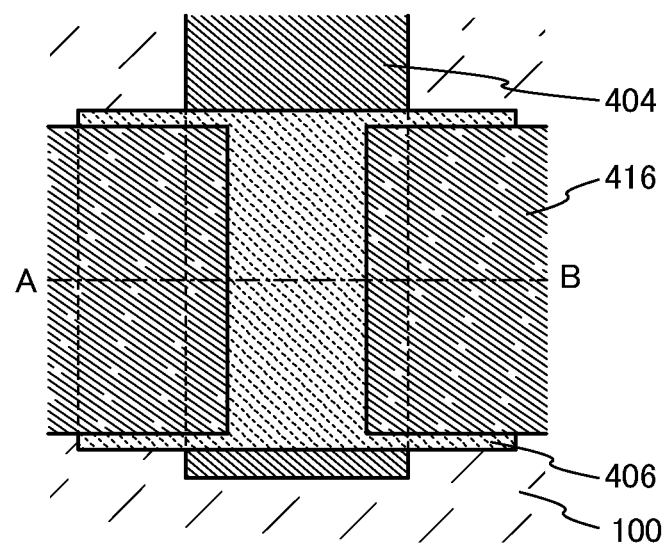
FIGS. 12A and 12B are a top view and a cross-sectional view illustrating an example of a transistor according to an embodiment of the present invention.
Figure 12B:
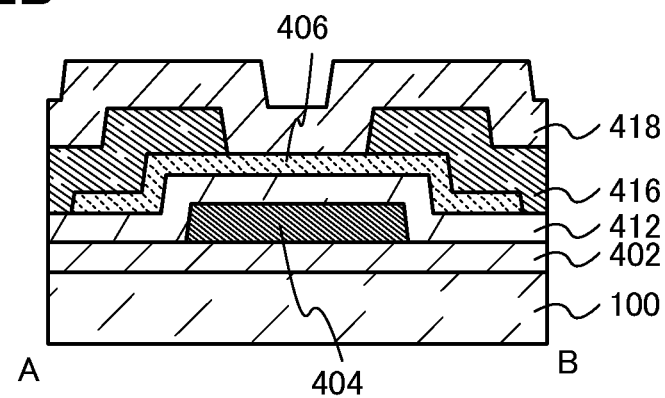

FIG. 12A is a top view of a transistor according to an embodiment of the present invention. FIG. 12B is a cross-sectional view along dashed-dotted line A-B in FIG. 12A. Note that for simplicity, a protective insulating film 418, a gate insulating film 412, and the like are not shown in FIG. 12A.

The transistor in FIG. 12B includes a base insulating film 402 provided over the substrate 100, a gate electrode 404 provided over the base insulating film 402, the gate insulating film 412 provided over the gate electrode 404, an oxide semiconductor film 406 provided to overlap with the gate electrode 404 with the gate insulating film 412 interposed therebetween, a pair of electrodes 416 provided over the oxide semiconductor film 406, and the protective insulating film 418 provided over the pair of electrodes 416.

Note that at least one of the gate insulating film 412 and the protective insulating film 418 is an insulating film having a profile of excess oxygen concentration having two or more local maximum values in the depth direction.

At least one of the gate insulating film 412 and the protective insulating film 418 is an insulating film having a profile of excess oxygen concentration having two or more local maximum values in the depth direction. Therefore, such an insulating film has plural conditions of oxygen release. For example, in the case where oxygen is released by heat treatment, the oxygen can be released at a wide range of temperatures. Accordingly, the oxygen can be supplied to the oxide semiconductor film 406 and the vicinity of the oxide semiconductor film 406 at a wide range of temperatures.

The excess oxygen in at least one of the gate insulating film 412 and the protective insulating film 418 is oxygen contained at the amount that exceeds the amount in the stoichiometric composition of a compound. Therefore, the excess oxygen is released when energy is applied. Since the excess oxygen is an excess, film quality does not deteriorate even when the excess oxygen is released from the film.

The description in Embodiment 1 is referred to for the substrate 100.

The base insulating film 402 is provided in order that an impurity due to the substrate 100 is prevented from affecting the oxide semiconductor film 406. Note that in the case where the substrate 100 does not include an impurity, the base insulating film 402 is not necessarily provided.

The base insulating film 402 can be formed to have a single-layer or stacked-layer structure using one or more insulating films including the following materials: aluminum oxide, aluminum nitride, magnesium oxide, silicon oxide, silicon oxynitride, germanium oxide, yttrium oxide, zirconium oxide, lanthanum oxide, neodymium oxide, hafnium oxide, and tantalum oxide. Further, silicon nitride oxide or silicon nitride may be stacked over the single layer or the stacked layer.

The gate electrode 404 may be formed using a conductive film similar to that of the gate electrode 104.

The gate insulating film 412 may be formed using an insulating film similar to that of the gate insulating film 112.

The oxide semiconductor film 406 may be formed using an oxide film similar to that of the oxide semiconductor film 106.

The pair of electrodes 416 may be formed using a conductive film similar to that of the pair of electrodes 116.

The protective insulating film 418 can be formed to have a single-layer or stacked-layer structure using one or more insulating films including the following materials: aluminum oxide, aluminum nitride, magnesium oxide, silicon oxide, silicon oxynitride, germanium oxide, yttrium oxide, zirconium oxide, lanthanum oxide, neodymium oxide, hafnium oxide, and tantalum oxide. Further, silicon nitride oxide or silicon nitride may be stacked over the single layer or the stacked layer.

It is preferable that the protective insulating film 418 have low relative permittivity and a sufficient thickness. For example, a silicon oxide film having a relative permittivity of approximately 3.8 and a thickness of greater than or equal to 200 nm and less than or equal to 1000 nm may be provided. A surface of the protective insulating film 418 has a little fixed charge because of the influence of atmospheric components and the like, which might cause the shift of the threshold voltage of the transistor. Therefore, it is preferable that the protective insulating film 418 have relative permittivity and a thickness such that the influence of the charge at the surface is sufficiently reduced. For the same reason, a resin film may be formed over the protective insulating film 418 to reduce the influence of the charge at the surface.

A method for manufacturing the transistor in FIG. 12B is described below with reference to FIGS. 13A to 13C and FIGS. 14A to 14C.

First, the substrate 100 is prepared and the base insulating film 402 is deposited over the substrate 100. The base insulating film 402 is preferably formed using any of the insulating films described as the insulating films used as the base insulating film 402 by a sputtering method, a CVD method, an MBE method, an ALD method, or a PLD method.

Then, a conductive film to be the gate electrode 404 is formed. The conductive film to be the gate electrode 404 is formed using any of the conductive films described as the conductive films used as the gate electrode 404 by a sputtering method, a CVD method, an MBE method, an ALD method, or a PLD method.

Figure 13A:
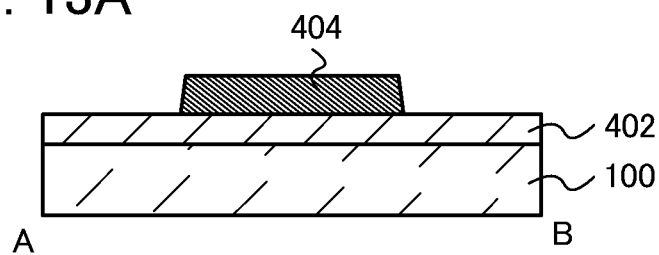
FIGS. 13A to 13C are cross-sectional views illustrating an example of a method for manufacturing a transistor according to an embodiment of the present invention.

Next, the conductive film to be the gate electrode 404 is processed, whereby the gate electrode 404 is formed (see FIG. 13A).

Next, a gate insulating film 412a is formed. The gate insulating film 412a may be formed using any of the insulating films described as the insulating films used as the gate insulating film 412 by a sputtering method, a CVD method, an MBE method, an ALD method, or a PLD method.

Here, the gate insulating film 412a is preferably subjected to dehydration or dehydrogenation treatment. Embodiment 1 is referred to for the dehydration or dehydrogenation treatment.

Figure 13B:
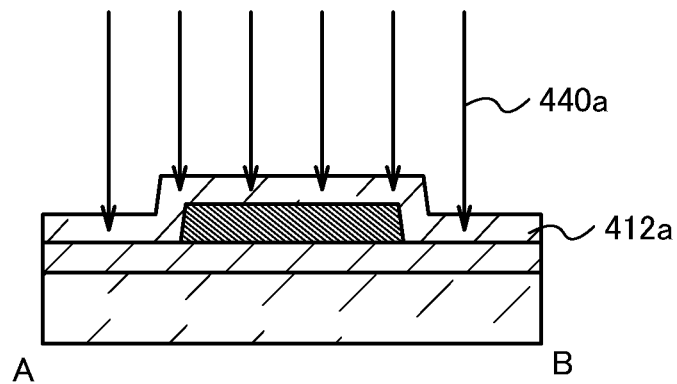

Next, oxygen 440a is added to the gate insulating film 412a from an upper surface side under a first condition (see FIG. 13B). The oxygen 440a may be added by an ion implantation method or an ion doping method. In that case, the acceleration voltage is set to higher than or equal to 10 kV and lower than or equal to 100 kV. Further, the amount of the oxygen 440a added is set to larger than or equal to $1 \times 10^{14}$ ions/cm$^2$ and smaller than or equal to $1 \times 10^{16}$ ions/cm$^2$.

The oxygen 440a is added to the gate insulating film 412a, whereby a gate insulating film 412b is formed.

Figure 13C:
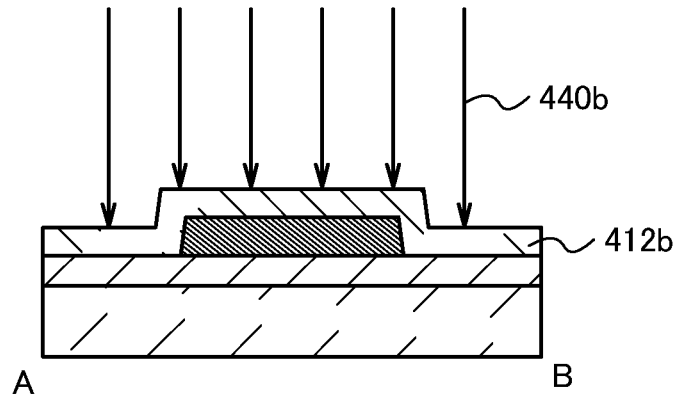

Next, oxygen 440b is added to the gate insulating film 412b from an upper surface side under a second condition (see FIG. 13C). The oxygen 440b may be added by an ion implantation method or an ion doping method. In that case, the acceleration voltage is set to higher than or equal to 1 kV and lower than 10 kV. Further, the amount of the oxygen 440b added is set to larger than or equal to $1\times10^{14}$ ions/cm$^2$ and smaller than or equal to $1\times10^{16}$ ions/cm$^2$.

Alternatively, the oxygen 440b may be added in such a manner that bias voltage is applied to the substrate side in plasma including oxygen. In that case, the bias voltage is set to higher than or equal to 10 V and lower than 1 kV. Further, the application time of the bias voltage may be set to longer than or equal to 10 seconds and shorter than or equal to 1000 seconds, preferably longer than or equal to 10 seconds and shorter than or equal to 200 seconds, further preferably longer than or equal to 10 seconds and shorter than or equal to 60 seconds. As the bias voltage is higher and the application time of the bias voltage is longer, the film is etched more.

Figure 14A:
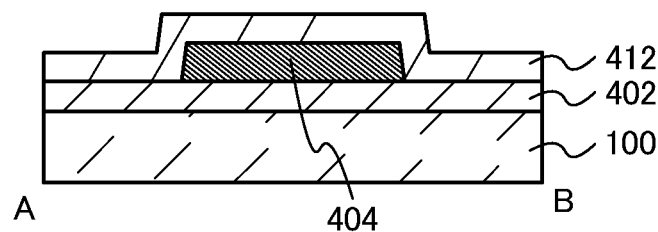
FIGS. 14A to 14C are cross-sectional views illustrating an example of a method for manufacturing a transistor according to an embodiment of the present invention.

The oxygen 440b is added to the gate insulating film 412b, whereby the gate insulating film 412 is formed (see FIG. 14A).

Further, in addition to the first condition and the second condition, oxygen may be added under third to n-th conditions (n is a natural number of 4 or larger).

The first condition and the second condition may be replaced with each other. Note that it is preferable that the depth at which oxygen is implanted under the first condition be deeper than that at which oxygen is implanted under the second condition. This is for the prevention of interference between oxygen added under the first condition and oxygen added under the second condition. This also applies to the case where oxygen is added n times; it is preferable that the depth at which oxygen is implanted be shallower in order of oxygen addition.

Thus, the gate insulating film 412 including the excess oxygen may be formed. Note that this embodiment is not limited to the case where the gate insulating film 412 includes the excess oxygen. In the case where the protective insulating film 418 described later includes excess oxygen, the gate insulating film 412 does not necessarily include excess oxygen in some cases.

Next, an oxide semiconductor film to be the oxide semiconductor film 406 is formed. The oxide semiconductor film to be the oxide semiconductor film 406 is formed using any of the oxide films described as the oxide films used as the oxide semiconductor film 406 by a sputtering method, a CVD method, an MBE method, an ALD method, or a PLD method.

Next, first heat treatment is performed. The first heat treatment may be performed under conditions selected from conditions similar to those of the first heat treatment described in Embodiment 1.

Figure 14B:
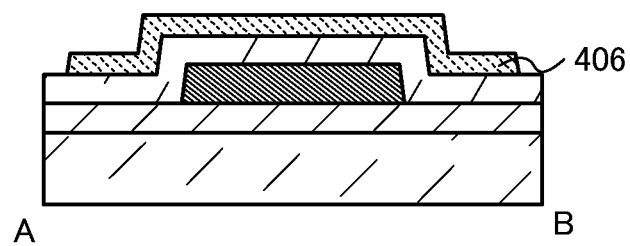

Next, the oxide semiconductor film to be the oxide semiconductor film 406 is processed to have an island shape; thus, the oxide semiconductor film 406 is formed (see FIG. 14B).

Next, a conductive film to be the pair of electrodes 416 is formed. The conductive film to be the pair of electrodes 416 is formed using any of the conductive films described as the conductive films used as the pair of electrodes 416 by a sputtering method, a CVD method, an MBE method, an ALD method, or a PLD method.

Then, the conductive film to be the pair of electrodes 416 is processed into the pair of electrodes 416.

Figure 14C:
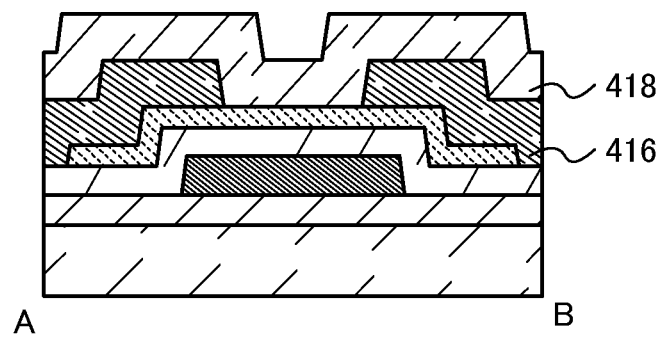

Then, the protective insulating film 418 is formed (see FIG. 14C). The protective insulating film 418 is preferably formed using any of the insulating films described as the insulating films used as the protective insulating film 418 by a sputtering method, a CVD method, an MBE method, an ALD method, or a PLD method.

In the case where an insulating film having a profile of excess oxygen concentration having two or more local maximum values in the depth direction is used as the protective insulating film 418, the excess oxygen may be included in accordance with the method illustrated in FIGS. 13B and 13C and FIG. 14A.

After formation of the protective insulating film 418, second heat treatment is preferably performed. The excess oxygen can be released from the gate insulating film 412 and/or the protective insulating film 418 by the second heat treatment. The released excess oxygen is supplied to the oxide semiconductor film 406 and the vicinity of the oxide semiconductor film 406; thus, oxygen vacancies can be reduced. The second heat treatment can be performed under a condition similar to that of the first heat treatment.

In this manner, the transistor in FIG. 12B can be manufactured.

According to this embodiment, a transistor with excellent electric characteristics can be provided. Further, a highly reliable semiconductor device including the transistor can be provided.

This embodiment can be combined with any of the other embodiments as appropriate.

Embodiment 5

In this embodiment, a liquid crystal display device manufactured using the transistor described in any of Embodiments 1 to 4 will be described. Note that although an example in which an embodiment of the present invention is applied to a liquid crystal display device is described in this embodiment, an embodiment of the present invention is not limited thereto. For example, application of an embodiment of the present invention to an electroluminescence (EL) display device, which is one of light-emitting devices, is readily conceived by those skilled in the art.

Figure 15:
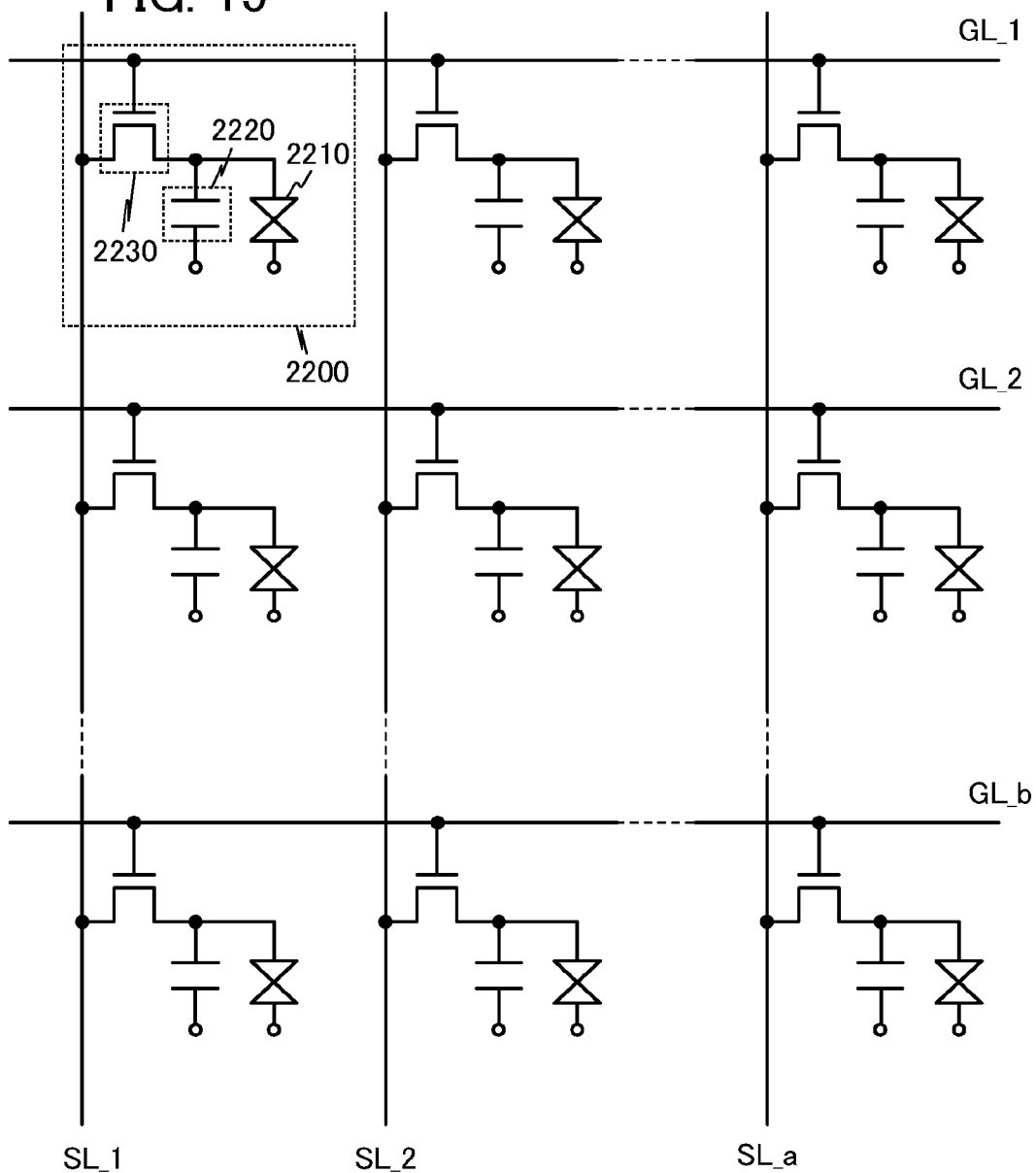
FIG. 15 is a circuit diagram illustrating an example of a liquid crystal display device according to an embodiment of the present invention.

FIG. 15 is a circuit diagram of an active matrix liquid crystal display device. The liquid crystal display device includes source wirings SL_1 to SL_a, gate wirings GL_1 to GL_b, and a plurality of pixels 2200. Each pixel 2200 includes a transistor 2230, a capacitor 2220, and a liquid crystal element 2210. The plurality of pixels 2200 with such a structure forms a pixel portion of the liquid crystal display device. In the case where a source wiring or a gate wiring is simply mentioned, it may be denoted as the source wiring SL or the gate wiring GL.

The transistor described in any of Embodiments 1 to 4 is used as the transistor 2230.

The gate wiring GL is connected to a gate of the transistor 2230, the source wiring SL is connected to a source of the transistor 2230, and a drain of the transistor 2230 is connected to one of capacitor electrodes of the capacitor 2220 and one of pixel electrodes of the liquid crystal element 2210. The other of the capacitor electrodes of the capacitor 2220 and the other of the pixel electrodes of the liquid crystal element 2210 are each connected to a common electrode. Note that the common electrode may be formed in the same layer as the gate wiring GL.

Further, the gate wiring GL is connected to a gate driver circuit. The gate driver circuit may include the transistor described in any of Embodiments 1 to 4.

The source wiring SL is connected to a source driver circuit. The source driver circuit may include the transistor described in any of Embodiments 1 to 4.

Note that one or both of the gate driver circuit and the source driver circuit may be formed over a separately prepared substrate and connected to each wiring by a method such as chip on glass (COG), wire bonding, or tape automated bonding (TAB).

Since a transistor is easily broken by static electricity or the like, a protection circuit is preferably provided. The protection circuit is preferably formed using a nonlinear element.

When a voltage that is higher than or equal to the threshold voltage of the transistor 2230 is applied to the gate wiring GL, electric charge supplied from the source wiring SL flows as drain current of the transistor 2230 and is accumulated in the capacitor 2220. After charging for one row, the transistors 2230 in the row are turned off and voltage application from the source wiring SL stops; however, necessary voltage can be kept by the electric charge accumulated in the capacitors 2220. Then, charging of the capacitors 2220 in the next row is carried out. In this manner, charging for the first row to the b-th row is carried out. Note that drain current is current that flows from a drain to a source through a channel in a transistor. The drain current flows when gate voltage is higher than the threshold voltage.

Note that the transistor 2230 has extremely small off-state current. Thus, the display rewriting frequency can be reduced in the case of an image with little motion (including a still image), which enables a further reduction in power consumption. In addition, the capacitance of the capacitor 2220 can be further reduced, so that power consumption needed for charging can be reduced.

The liquid crystal display device can be highly reliable because in the transistor 2230, change in electric characteristics which results from operation of the transistor is small.

In the above-described manner, according to an embodiment of the present invention, a liquid crystal display device with high reliability and low power consumption can be provided.

This embodiment can be combined with any of the other embodiments as appropriate.

Embodiment 6

In this embodiment, an example of manufacturing a semiconductor memory device using the transistor described in any of Embodiments 1 to 4 will be described.

Typical examples of a volatile semiconductor memory device include a dynamic random access memory (DRAM) which stores data by selecting a transistor included in a memory element and accumulating an electric charge in a capacitor, and a static random access memory (SRAM) which holds stored data using a circuit such as a flip-flop.

Typical examples of a nonvolatile semiconductor memory device include a flash memory which has a node between a gate and a channel region of a transistor and stores data by holding an electric charge in the node.

The transistor described in any of Embodiments 1 to 4 can be applied to some of transistors included in the above-described semiconductor memory device.

First, a memory cell included in a semiconductor memory device to which the transistor described in any of Embodiments 1 to 4 is applied will be described with reference to FIGS. 16A and 16B.

Figure 16A:
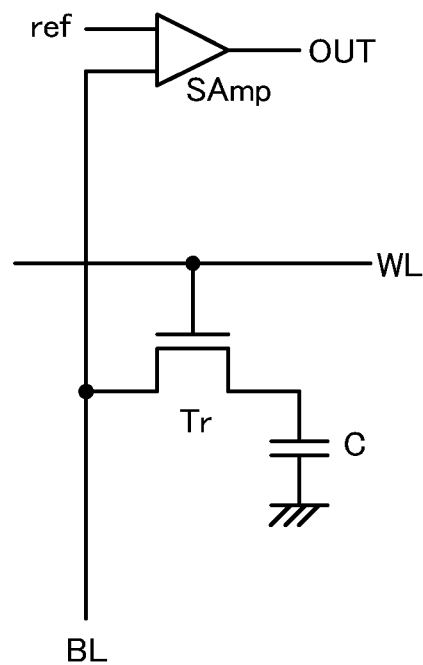
FIG. 16A is a circuit diagram illustrating an example of a semiconductor memory device according to an embodiment of the present invention and FIG. 16B shows electric characteristics thereof.

The memory cell includes a bit line BL, a word line WL, a sense amplifier SAmp, a transistor Tr, and a capacitor C (see FIG. 16A).

Figure 16B:
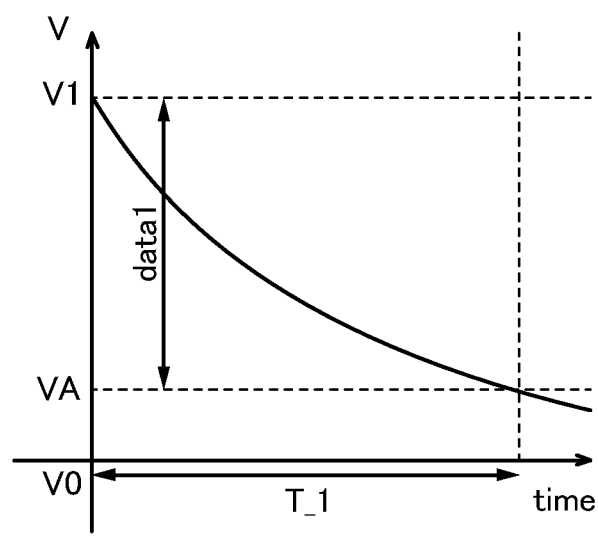

Note that it is known that the voltage held in the capacitor C is gradually decreased with time as shown in FIG. 16B owing to the off-state current of the transistor Tr. Voltage originally charged from V0 to V1 is decreased with time to VA that is a limit for reading out data 1. This period is called a holding period T_1. In the case of a two-level memory cell, refresh operation needs to be performed within the holding period T_1.

Here, when the transistor described in any of Embodiments 1 to 4 is used as the transistor Tr, the holding period T_1 can be increased because off-state current of the transistor is small. That is, frequency of the refresh operation can be reduced; thus, power consumption can be reduced. For example, in the case where a memory cell is formed using a transistor that includes an oxide semiconductor film and has an off-state current of $1 \times 10^{-21}$ A to $1 \times 10^{-25}$ A, data can be held for several days to several decades without supply of electric power.

When the transistor described in any of Embodiments 1 to 4, whose change in electric characteristics resulting from operation is small, is applied to the transistor Tr, the semiconductor memory device can be highly reliable.

As described above, according to an embodiment of the present invention, a semiconductor memory device with high reliability and low power consumption can be provided.

Next, another example of a memory cell included in a semiconductor memory device to which the transistor described in any of Embodiments 1 to 4 is applied, which is different from the memory cell described in FIGS. 16A and 16B, is described with reference to FIGS. 17A and 17B.

Figure 17A:
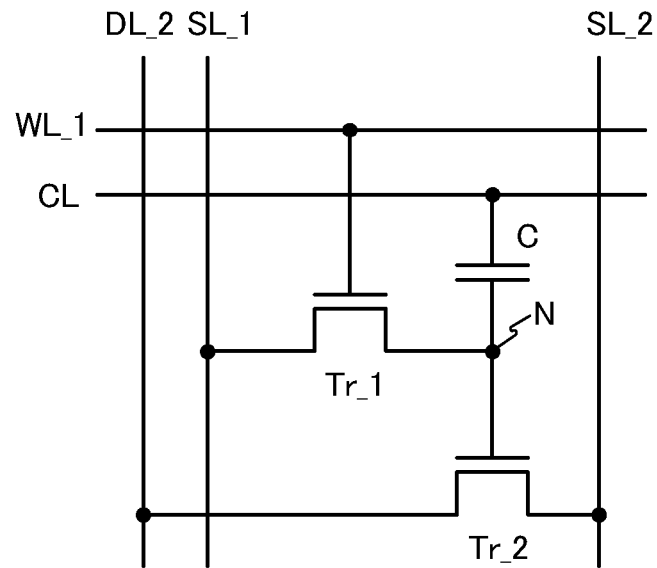
FIG. 17A is a circuit diagram illustrating an example of a semiconductor memory device according to an embodiment of the present invention and FIG. 17B shows electric characteristics thereof.
Figure 17B:
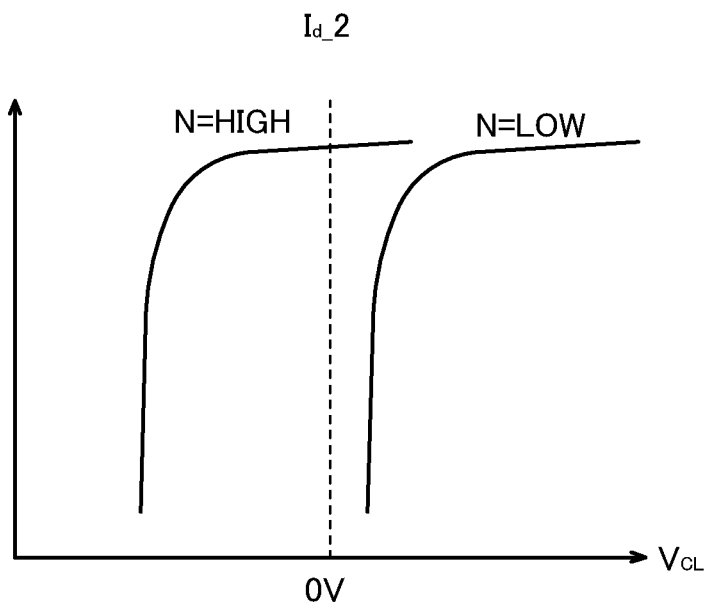

FIG. 17A is a circuit diagram of a memory cell. The memory cell includes a transistor Tr_1, a word line WL_1 connected to a gate of the transistor Tr_1, a source wiring SL_1 connected to a source of the transistor Tr_1, a transistor Tr_2, a source wiring SL_2 connected to a source of the transistor Tr_2, a drain wiring DL_2 connected to a drain of the transistor Tr_2, a capacitor C, a capacitor wiring CL connected to one terminal of the capacitor C, and a node N connected to the other terminal of the capacitor C, a drain of the transistor Tr_1, and a gate of the transistor Tr_2.

Note that the semiconductor memory device described in this embodiment utilizes variation in the threshold voltage of the transistor Tr_2, which depends on the potential of the node N. For example, FIG. 17B is a graph showing a relation between the drain current $I_d\_2$ flowing through the transistor Tr_2 and the voltage $V_{CL}$ of the capacitor wiring CL.

Here, the potential of the node N can be adjusted through the transistor Tr_1. For example, the potential of the source wiring SL_1 is set to VDD. In this case, when the potential of the word line WL_1 is set to be higher than or equal to a potential obtained by adding VDD to the threshold voltage Vth of the transistor Tr_1, the potential of the node N can be HIGH. Further, when the potential of the word line WL_1 is set to be lower than or equal to the threshold voltage Vth of the transistor Tr_1, the potential of the node N can be LOW.

Thus, either a $V_{CL}$-$I_d\_2$ curve (N=LOW) or a $V_{CL}$-$I_d\_2$ curve (N=HIGH) can be obtained. That is, when N=LOW, $I_d\_2$ is small at a $V_{CL}$ of 0 V; accordingly, data 0 is stored. Further, when N=HIGH, $I_d\_2$ is large at a $V_{CL}$ of 0 V; accordingly, data 1 is stored. In such a manner, data can be stored.

Here, when the transistor described in any of Embodiments 1 to 4 is used as the transistor Tr_1, the off-state current of the transistor can be extremely small; therefore, unintentional leakage of an electric charge accumulated in the node N by flowing between the source and the drain of the transistor Tr_1 can be suppressed. As a result, data can be held for a long time. Further, since high voltage is not needed in writing, power consumption can be reduced as compared to a flash memory or the like.

When the transistor described in any of Embodiments 1 to 4, whose change in electric characteristics resulting from operation is small, is applied to the transistor Tr_1, the semiconductor memory device can be highly reliable.

Note that the transistor described in any of Embodiments 1 to 4 may be used as the transistor Tr_2.

As described above, according to an embodiment of the present invention, a semiconductor memory device with low power consumption and high reliability can be obtained.

This embodiment can be combined with any of the other embodiments as appropriate.

Embodiment 7

A central processing unit (CPU) can be formed using the transistor described in any of Embodiments 1 to 4 or the semiconductor memory device described in Embodiment 6 for at least part of the CPU.

Figure 18A:
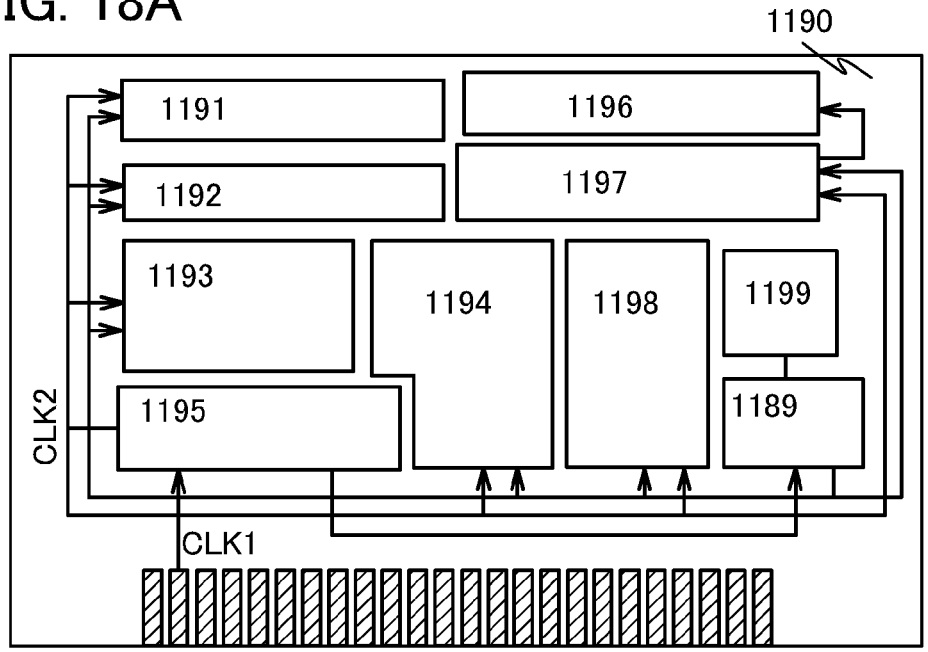
FIG. 18A is a block diagram illustrating a specific example of a CPU according to an embodiment of the present invention and FIGS. 18B and 18C are circuit diagrams each illustrating part of the CPU.

FIG. 18A is a block diagram illustrating a specific structure of the CPU. The CPU illustrated in FIG. 18A includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and a ROM interface (ROM I/F) 1189 over a substrate 1190. A semiconductor substrate, an SOI substrate, a glass substrate, or the like is used as the substrate 1190. The ROM 1199 and the ROM interface 1189 may be provided over a separate chip. Obviously, the CPU shown in FIG. 18A is just an example in which the structure is simplified, and an actual CPU may have various structures depending on the application.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the clock signal CLK2 to the above circuits.

In the CPU illustrated in FIG. 18A, a memory element is provided in the register 1196. As the memory element in the register 1196, for example, the semiconductor memory device described in Embodiment 6 can be used.

In the CPU illustrated in FIG. 18A, the register controller 1197 selects operation of retaining data in the register 1196 in accordance with an instruction from the ALU 1191. That is, the register controller 1197 selects whether data is retained by a flip-flop or a capacitor in the memory element included in the register 1196. When data is retained by the flip-flop, power supply voltage is supplied to the memory element in the register 1196. When data is retained by the capacitor, the data in the capacitor is rewritten, and supply of the power supply voltage to the memory element in the register 1196 can be stopped.

Figure 18B:
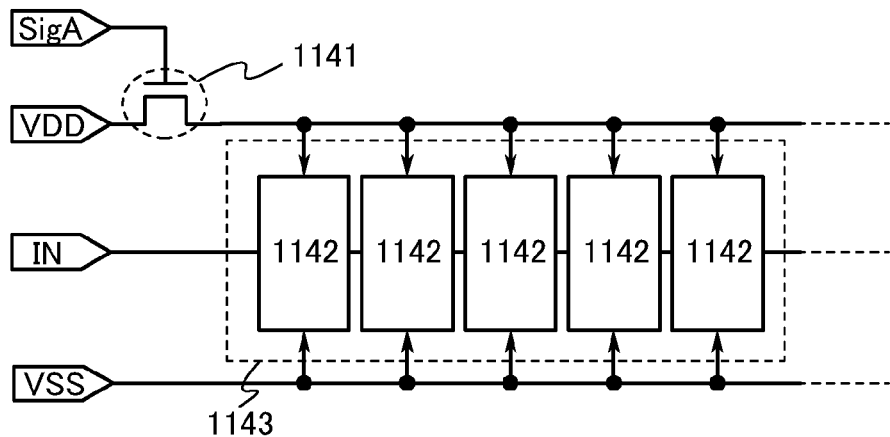
Figure 18C:
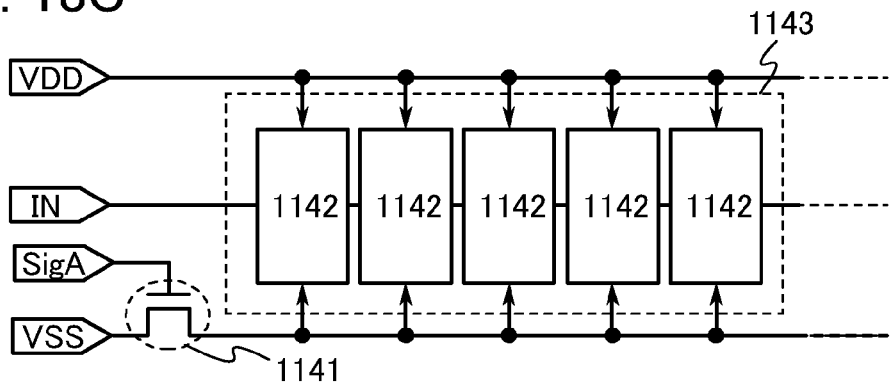

A switching element provided between a memory element group and a node to which a power supply potential VDD or a power supply potential VSS is supplied, as illustrated in FIG. 18B or FIG. 18C, allows the power supply voltage to be stopped. Circuits illustrated in FIGS. 18B and 18C will be described below.

FIGS. 18B and 18C each illustrate an example of a structure including the transistor described in any of Embodiments 1 to 4 as a switching element for controlling supply of power supply voltage to a memory element.

The memory device illustrated in FIG. 18B includes a switching element 1141 and a memory element group 1143 including a plurality of memory elements 1142. Specifically, as each of the memory elements 1142, the semiconductor memory device described in Embodiment 6 can be used. Each of the memory elements 1142 included in the memory element group 1143 is supplied with the high-level power supply potential VDD through the switching element 1141. Further, each of the memory elements 1142 included in the memory element group 1143 is supplied with a potential of a signal IN and the low-level power supply potential VSS.

In FIG. 18B, a transistor having significantly small off-state current is used as the switching element 1141, and the switching of the transistor is controlled by a signal SigA supplied to a gate thereof.

Note that FIG. 18B illustrates the structure in which the switching element 1141 includes only one transistor; however, an embodiment of the present invention is not limited thereto. The switching element 1141 may include a plurality of transistors. In the case where the switching element 1141 includes a plurality of transistors which serves as switching elements, the plurality of transistors may be connected to each other in parallel, in series, or in combination of parallel connection and series connection.

In FIG. 18C, an example of a memory device in which each of the memory elements 1142 included in the memory element group 1143 is supplied with the low-level power supply potential VSS through the switching element 1141 is illustrated. The supply of the low-level power supply potential VSS to each of the memory elements 1142 included in the memory element group 1143 can be controlled by the switching element 1141.

When a switching element is provided between a memory element group and a node to which the power supply potential VDD or the power supply potential VSS is supplied, data can be retained even in the case where operation of a CPU is temporarily stopped and the supply of the power supply voltage is stopped; accordingly, power consumption can be reduced. For example, while a user of a personal computer does not input data to an input device such as a keyboard, the operation of the CPU can be stopped, so that the power consumption can be reduced.

Although the CPU is given as an example, an embodiment of the present invention can also be applied to an LSI such as a digital signal processor (DSP), a custom LSI, or a field programmable gate array (FPGA).

This embodiment can be combined with any of the other embodiments as appropriate.

Embodiment 8

In this embodiment, examples of electronic devices to which any of Embodiments 1 to 7 is applied will be described.

Figure 19A:
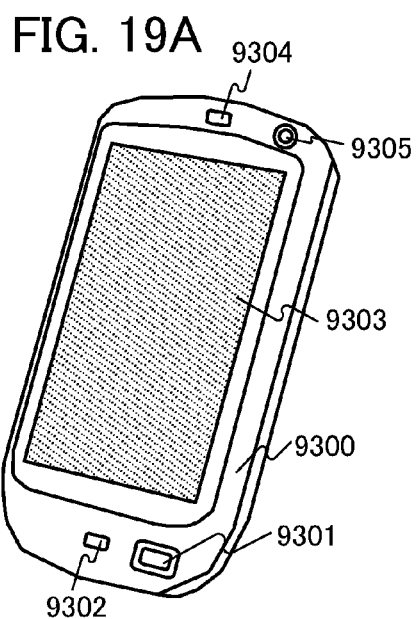
FIGS. 19A to 19D are perspective views each illustrating an example of an electronic device according to an embodiment of the present invention.

FIG. 19A illustrates a portable information terminal. The portable information terminal illustrated in FIG. 19A includes a housing 9300, a button 9301, a microphone 9302, a display portion 9303, a speaker 9304, and a camera 9305, and has a function as a mobile phone. An embodiment of the present invention can be applied to the display portion 9303 and the camera 9305. Although not illustrated, an embodiment of the present invention can also be applied to an arithmetic device, a wireless circuit, or a memory circuit in a main body.

Figure 19B:
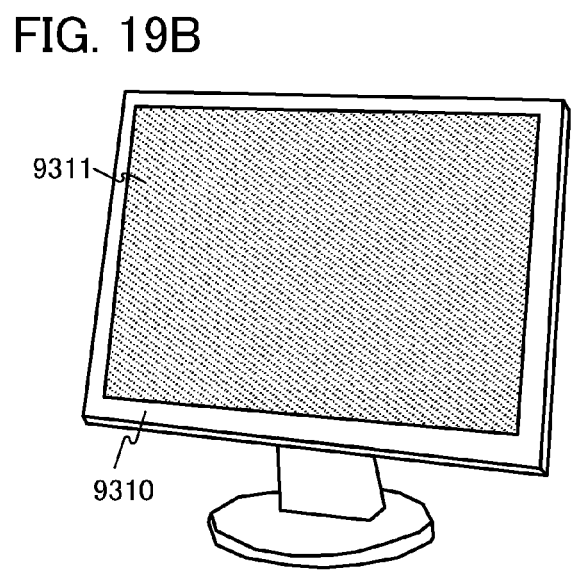

FIG. 19B illustrates a display. The display illustrated in FIG. 19B includes a housing 9310 and a display portion 9311. An embodiment of the present invention can be applied to the display portion 9311. By application of an embodiment of the present invention, a display with low power consumption and high reliability can be provided.

Figure 19C:
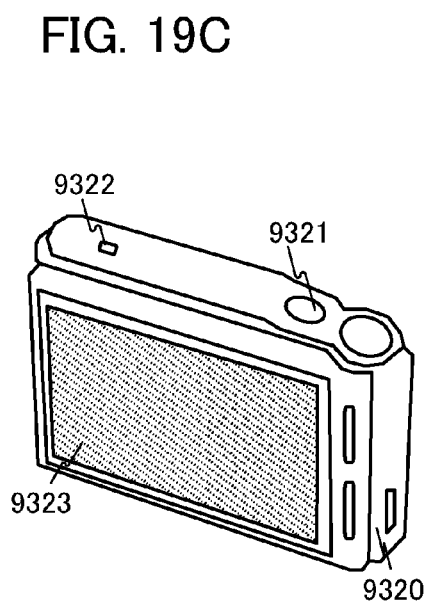

FIG. 19C illustrates a digital still camera. The digital still camera illustrated in FIG. 19C includes a housing 9320, a button 9321, a microphone 9322, and a display portion 9323. An embodiment of the present invention can be applied to the display portion 9323. Although not illustrated, an embodiment of the present invention can also be applied to a memory circuit or an image sensor.

Figure 19D:
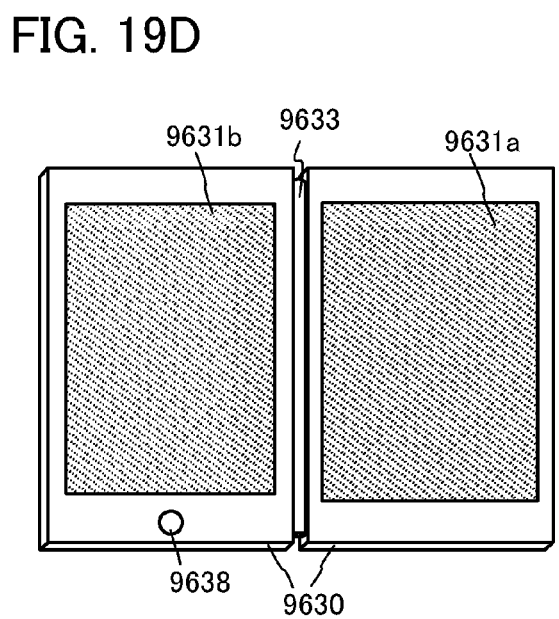

FIG. 19D illustrates a double-foldable portable information terminal. The double-foldable portable information terminal illustrated in FIG. 19D includes a housing 9630, a display portion 9631a, a display portion 9631b, a hinge 9633, and an operation switch 9638. An embodiment of the present invention can be applied to the display portion 9631a and the display portion 9631b. Although not illustrated, an embodiment of the present invention can also be applied to an arithmetic device, a wireless circuit, or a memory circuit in a main body.

Part or whole of the display portion 9631a and/or the display portion 9631b can function as a touch panel. By touching an operation key displayed on the touch panel, a user can input data, for example.

With the use of a semiconductor device according to an embodiment of the present invention, performance of an electronic device can be improved, power consumption of the electronic device can be reduced, and the reliability of the electronic device can be improved.

This embodiment can be combined with any of the other embodiments as appropriate.

Example 1

This example shows calculation results of the concentration of oxygen injected into a silicon oxide film in the depth direction in the case where oxygen ions were injected plural times. Note that oxygen added by oxygen ion injection is excess oxygen in the silicon oxide film.

For the calculation, a transport of ion in matter (TRIM) was used.

The silicon oxide film used for the calculation had a thickness of 200 nm and a film density of 2.2 g/cm$^3$.

Figure 20A:
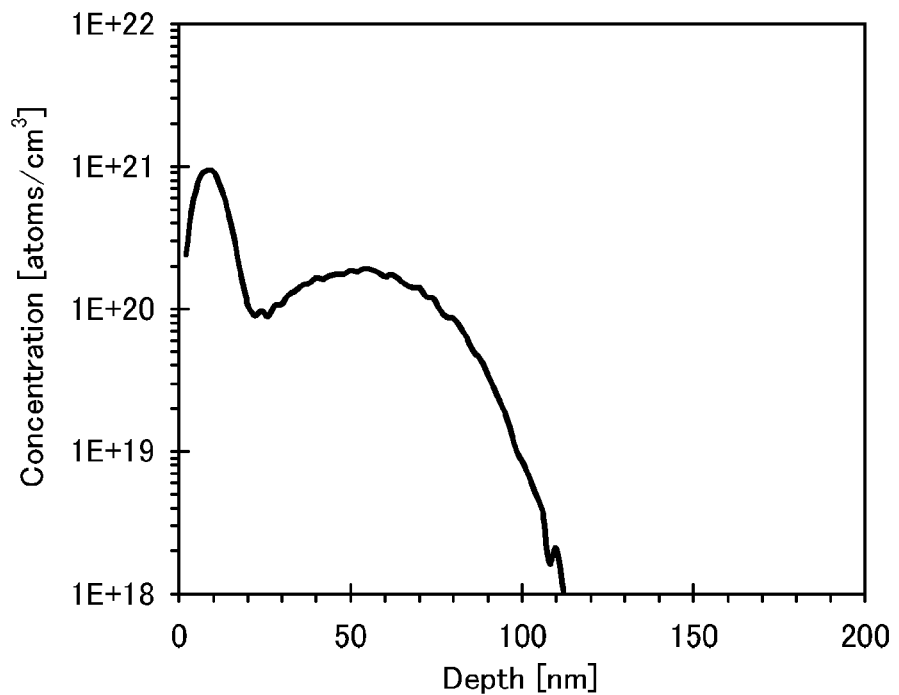
FIGS. 20A and 20B each show a calculation result of oxygen implantation depth.

FIG. 20A shows the concentration of oxygen injected into the silicon oxide film under a first condition that oxygen ions were injected with an acceleration voltage of 20 kV and a dosage of $1\times10^{15}$ ions/cm$^2$ and a second condition that oxygen ions were injected with an acceleration voltage of 2.5 kV and a dosage of $1\times10^{15}$ ions/cm$^2$.

According to FIG. 20A, a silicon oxide film was obtained which had a profile of the concentration of the injected oxygen having the local maximum value at a depth of 50 nm to 60 nm derived from the first condition and the local maximum value at a depth of approximately 10 nm derived from the second condition.

Figure 20B:
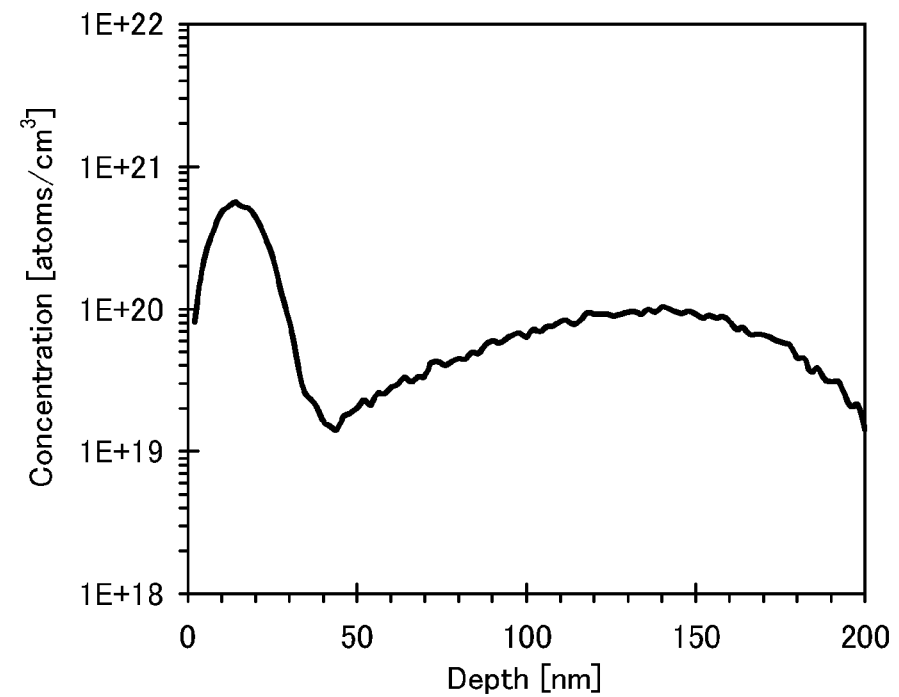

FIG. 20B shows the concentration of oxygen injected into the silicon oxide film under a first condition that oxygen ions were injected with an acceleration voltage of 50 kV and a dosage of $1\times10^{15}$ ions/cm$^2$ and a second condition that oxygen ions were injected with an acceleration voltage of 5 kV and a dosage of $1\times10^{15}$ ions/cm$^2$.

According to FIG. 20B, a silicon oxide film was obtained which had a profile of the concentration of the injected oxygen having the local maximum value at a depth of 120 nm to 160 nm derived from the first condition and the local maximum value at a depth of 10 nm to 20 nm derived from the second condition.

Figure 21A:
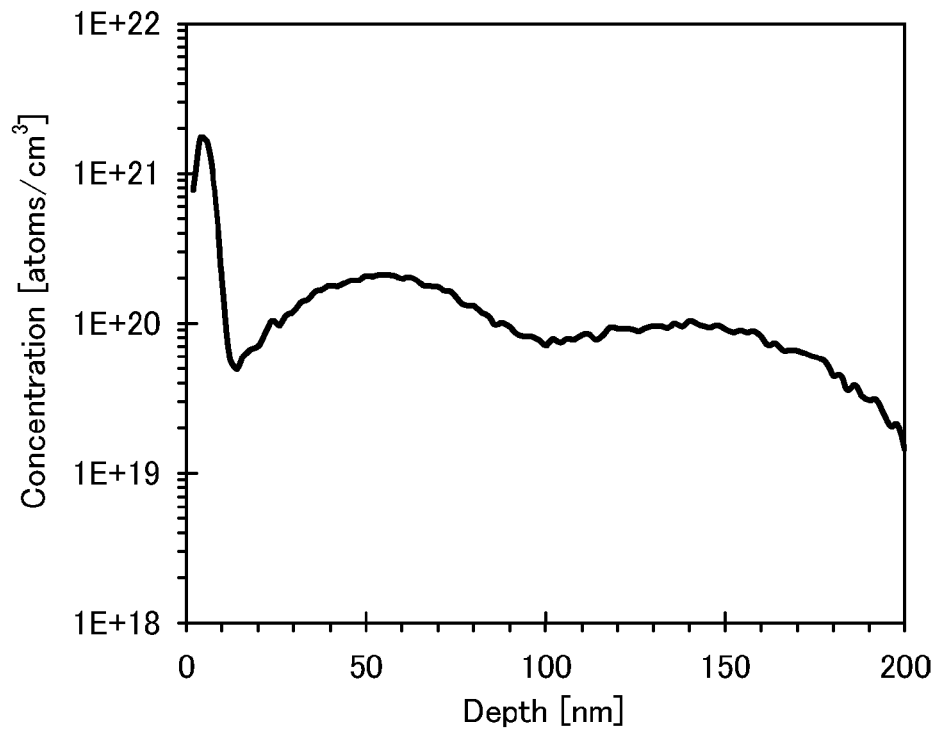
FIGS. 21A and 21B each show a calculation result of oxygen implantation depth.

FIG. 21A shows the concentration of oxygen injected into the silicon oxide film under a first condition that oxygen ions were injected with an acceleration voltage of 50 kV and a dosage of $1\times10^{15}$ ions/cm$^2$, a second condition that oxygen ions were injected with an acceleration voltage of 20 kV and a dosage of $1\times10^{15}$ ions/cm$^2$, and a third condition that oxygen ions were injected with an acceleration voltage of 1 kV and a dosage of $1\times10^{15}$ ions/cm$^2$.

According to FIG. 21A, a silicon oxide film was obtained which had a profile of the concentration of the injected oxygen having the local maximum value at a depth of 120 nm to 160 nm derived from the first condition, the local maximum value at a depth of 50 nm to 60 nm derived from the second condition, and the local maximum value at a depth of approximately 4 nm derived from the third condition.

Figure 21B:
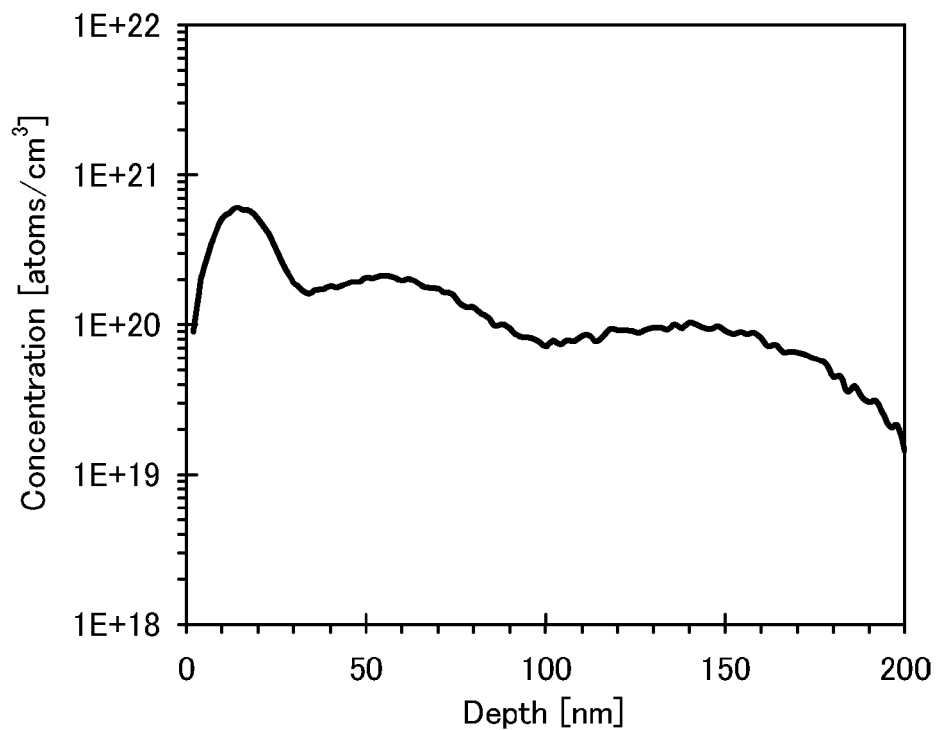

FIG. 21B shows the concentration of oxygen injected into the silicon oxide film under a first condition that oxygen ions were injected with an acceleration voltage of 50 kV and a dosage of $1\times10^{15}$ ions/cm$^2$, a second condition that oxygen ions were injected with an acceleration voltage of 20 kV and a dosage of $1\times10^{15}$ ions/cm$^2$, and a third condition that oxygen ions were injected with an acceleration voltage of 5 kV and a dosage of $1\times10^{15}$ ions/cm$^2$.

According to FIG. 21B, a silicon oxide film was obtained which had a profile of the concentration of the injected oxygen having the local maximum value at a depth of 120 nm to 160 nm derived from the first condition, the local maximum value at a depth of 50 nm to 60 nm derived from the second condition, and the local maximum value at a depth of 10 nm to 20 nm derived from the third condition.

According to this example, it can be found that a silicon oxide film having a profile of the concentration of injected oxygen having a plurality of local maximum values is obtained by injecting oxygen ions plural times.

This application is based on Japanese Patent Application serial no. 2011-281566 filed with Japan Patent Office on Dec. 22, 2011, the entire contents of which are hereby incorporated by reference.

What is claimed is:

1. A method for manufacturing a semiconductor device comprising the steps of:
   forming a first insulating film;
   performing a first oxygen addition on the first insulating film under a first condition;
   performing a second oxygen addition on the first insulating film subjected to the first oxygen addition, under a second condition; and
   forming an oxide semiconductor film over the first insulating film subjected to the second oxygen addition,
   wherein the first oxygen addition and the second oxygen addition are performed by an ion implantation method or an ion doping method, and wherein an acceleration voltage of the first condition and an acceleration voltage of the second condition are different from each other.

2. The method for manufacturing a semiconductor device according to claim 1, further comprising the step of heating the first insulating film and the oxide semiconductor film after forming the oxide semiconductor film.

3. The method for manufacturing a semiconductor device according to claim 1,
wherein a depth in the first insulating film at which the largest value of a concentration of oxygen added under the first condition appears is different from a depth in the first insulating film at which the largest value of a concentration of oxygen added under the second condition appears.

4. The method for manufacturing a semiconductor device according to claim 1,
wherein an amount of the oxygen added by the first oxygen addition is larger than or equal to $1\times10^{14}$ ions/cm$^2$ and smaller than or equal to $1\times10^{16}$ ions/cm$^2$, and
wherein an amount of the oxygen added by the second oxygen addition is larger than or equal to $1\times10^{14}$ ions/cm$^2$ and smaller than or equal to $1\times10^{16}$ ions/cm$^2$.

5. The method for manufacturing a semiconductor device according to claim 1, further comprising the step of forming a second insulating film over the oxide semiconductor film.

6. The method for manufacturing a semiconductor device according to claim 1, further comprising the steps of:
performing a third oxygen addition on the second insulating film under a third condition; and
performing a fourth oxygen addition on the second insulating film subjected to the third oxygen addition, under a fourth condition,
wherein the third condition and the fourth condition are different from each other.

7. The method for manufacturing a semiconductor device according to claim 6,
wherein the third condition is an acceleration voltage of higher than or equal to 10 kV and lower than or equal to 100 kV by an ion implantation method or an ion doping method, and
wherein the fourth condition is an acceleration voltage of higher than or equal to 1 kV and lower than 10 kV by an ion implantation method or an ion doping method.

8. The method for manufacturing a semiconductor device according to claim 6,
wherein an amount of the oxygen added by the third oxygen addition is larger than or equal to $1\times10^{14}$ ions/cm$^2$ and smaller than or equal to $1\times10^{16}$ ions/cm$^2$, and
wherein an amount of the oxygen added by the fourth oxygen addition is larger than or equal to $1\times10^{14}$ ions/cm$^2$ and smaller than or equal to $1\times10^{16}$ ions/cm$^2$.

9. A method for manufacturing a semiconductor device comprising the steps of:
forming an insulating film;
performing a first oxygen addition on the insulating film under a first condition;
performing a second oxygen addition on the insulating film subjected to the first oxygen addition, under a second condition;
forming an oxide semiconductor film over the insulating film subjected to the second oxygen addition;
forming a gate insulating film over the oxide semiconductor film; and
forming a gate electrode over the gate insulating film
wherein the first oxygen addition and the second oxygen addition are performed by an ion implantation method or an ion doping method, and
wherein an acceleration voltage of the first condition and an acceleration voltage of the second condition are different from each other.

10. The method for manufacturing a semiconductor device according to claim 9, further comprising the step of heating the insulating film, the oxide semiconductor film, and the gate insulating film after forming the gate electrode.

11. The method for manufacturing a semiconductor device according to claim 9,
wherein a depth in the insulating film at which the largest value of a concentration of oxygen added under the first condition appears is different from a depth in the insulating film at which the largest value of a concentration of oxygen added under the second condition appears.

12. The method for manufacturing a semiconductor device according to claim 9,
wherein an amount of the oxygen added by the first oxygen addition is larger than or equal to $1\times10^{14}$ ions/cm$^2$ and smaller than or equal to $1\times10^{16}$ ions/cm$^2$, and
wherein an amount of the oxygen added by the second oxygen addition is larger than or equal to $1\times10^{14}$ ions/cm$^2$ and smaller than or equal to $1\times10^{16}$ ions/cm$^2$.

13. The method for manufacturing a semiconductor device according to claim 9, further comprising the steps of:
performing a third oxygen addition on the gate insulating film under a third condition; and
performing a fourth oxygen addition on the gate insulating film subjected to the third oxygen addition, under a fourth condition,
wherein the third condition and the fourth condition are different from each other.

14. The method for manufacturing a semiconductor device according to claim 13,
wherein the third condition is an acceleration voltage of higher than or equal to 10 kV and lower than or equal to 100 kV by an ion implantation method or an ion doping method, and
wherein the fourth condition is an acceleration voltage of higher than or equal to 1 kV and lower than 10 kV by an ion implantation method or an ion doping method.

15. The method for manufacturing a semiconductor device according to claim 13,
wherein an amount of the oxygen added by the third oxygen addition is larger than or equal to $1\times10^{14}$ ions/cm$^2$ and smaller than or equal to $1\times10^{16}$ ions/cm$^2$, and
wherein an amount of the oxygen added by the fourth oxygen addition is larger than or equal to $1\times10^{14}$ ions/cm$^2$ and smaller than or equal to $1\times10^{16}$ ions/cm$^2$.

* * * * *

UNITED STATES PATENT AND TRADEMARK OFFICE
CERTIFICATE OF CORRECTION

PATENT NO.         : 9,099,303 B2                                          Page 1 of 1
APPLICATION NO.    : 14/208280
DATED              : August 4, 2015
INVENTOR(S)        : Shunpei Yamazaki It is certified that error appears in the above-identified patent and that said Letters Patent is hereby corrected as shown below:

IN THE SPECIFICATION

At column 10, line 41, "So represents" should be --$S_0$ represents--;

At column 24, line 43, "$V_{CL,}$" should be --$V_{CL}$--;

IN THE CLAIMS

In claim 6, column 29, line 28, "claim 1," should be --claim 5,--.

Signed and Sealed this
Twenty-second Day of March, 2016

Michelle K. Lee
*Director of the United States Patent and Trademark Office*